US006452437B1

(12) United States Patent
Takeuchi et al.

(10) Patent No.: US 6,452,437 B1
(45) Date of Patent: Sep. 17, 2002

(54) VOLTAGE GENERATOR FOR COMPENSATING FOR TEMPERATURE DEPENDENCY OF MEMORY CELL CURRENT

(75) Inventors: Ken Takeuchi, Tokyo; Tomoharu Tanaka, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/624,007

(22) Filed: Jul. 21, 2000

(30) Foreign Application Priority Data

Jul. 22, 1999 (JP) ............................................. 11-207794

(51) Int. Cl.[7] .............................. H01L 35/00; H03K 3/42
(52) U.S. Cl. ....................................... 327/513; 327/541
(58) Field of Search ................................ 327/538, 540, 327/541, 543, 378, 512, 513

(56) References Cited

U.S. PATENT DOCUMENTS

| 5,781,043 A | * | 7/1998 | Slemmer ...................... 327/78 |
| 5,864,504 A | | 1/1999 | Tanzawa et al. ......... 365/185.24 |
| 6,016,051 A | * | 1/2000 | Can ............................. 323/315 |
| 6,060,874 A | * | 5/2000 | Doorenbos .................. 323/316 |
| 6,091,286 A | * | 7/2000 | Blauschild .................. 327/543 |
| 6,160,391 A | | 12/2000 | Banba | |

FOREIGN PATENT DOCUMENTS

| JP | 359031404 A | * | 2/1984 |
| JP | 404181130 A | * | 6/1992 |

OTHER PUBLICATIONS

1999 IEEE International Solid–State Circuits Conference Digest of Technical Papers, Atsushi Nozoe, et al., "A 256Mb Multilevel Flash Memory with 2MB/s Program Rate for Mass Storage Applications", Feb. 1999, pp. 110–111.

* cited by examiner

Primary Examiner—Terry D. Cunningham
Assistant Examiner—Quan Tra
(74) Attorney, Agent, or Firm—Banner & Witcoff, Ltd.

(57) ABSTRACT

A voltage generator includes first to fourth current sources, first to fourth MOS transistors and a resistor. The first and second current sources created constant currents which are independent of a temperature change, and the third and fourth current sources create currents which vary in proportion to a temperature change. The resistor acts as a current/voltage converter for converting a current into a voltage. The first current source and the current path of the first MOS transistor are serially connected between a power supply and an output terminal. The second current source and the current path of the second MOS transistor are serially connected between the output terminal and a ground node. The third current source and the current path of the third MOS transistor are serially connected between the power supply and the output terminal. The fourth current source and the current path of the fourth MOS transistor are serially connected between the output terminal and the ground node. The gates of the first to fourth MOS transistors are supplied with first to fourth enable signals. The first to fourth MOS transistors are controlled so as to be selectively set into ON/OFF states by the first to fourth enable signals and the temperature characteristic is variously adjusted both in the positive and negative directions.

44 Claims, 16 Drawing Sheets

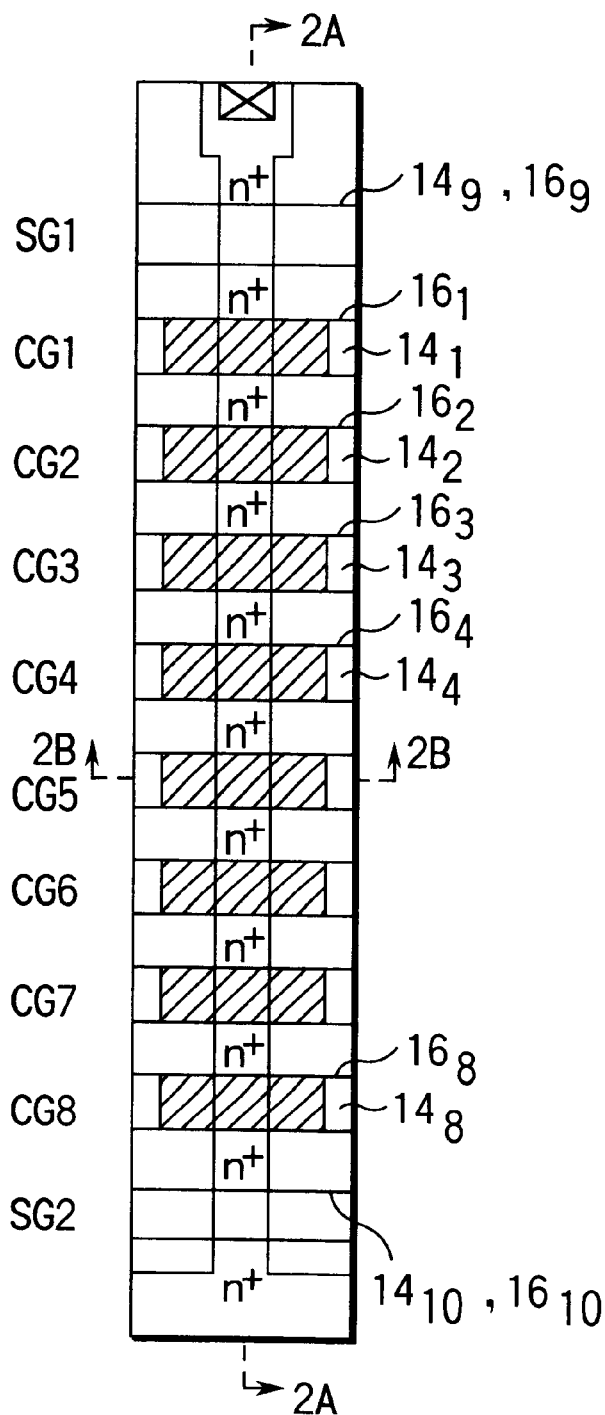
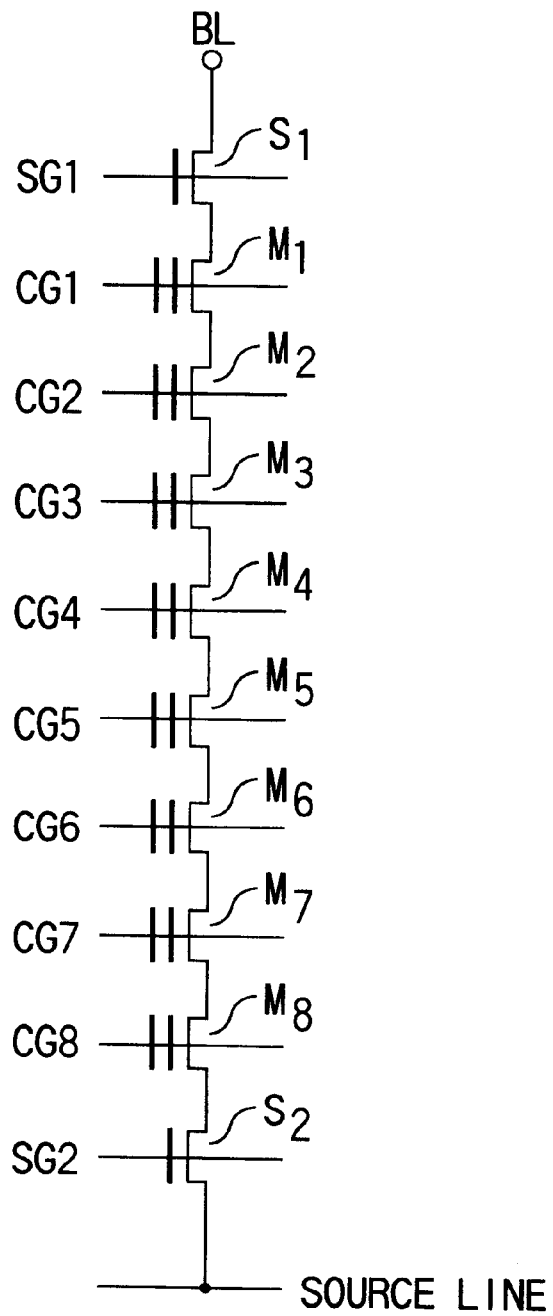
FIG. 1A
FIG. 1B

|  | -20°C | 32.5°C | 85°C | VARIATION IN OUTPUT VOLTAGE WITH TEMPERATURE CHANGE |
|---|---|---|---|---|
| Vcg01ref | 0.92V | 0.89V | 0.85V | −67mV/100°C |
| Vcg01 | 1.37V | 1.33V | 1.28V | −100mV/100°C |
| Vcg00ref | 0.92V | 0.88V | 0.83V | −100mV/100°C |
| Vcg00 | 0.92V | 0.88V | 0.83V | −100mV/100°C |
| Vcg10ref | 1.01V | 0.86V | 0.7V | −295mV/100°C |
| Vcg10 | 0.34V | 0.29V | 0.24V | −100mV/100°C |
FIG. 13
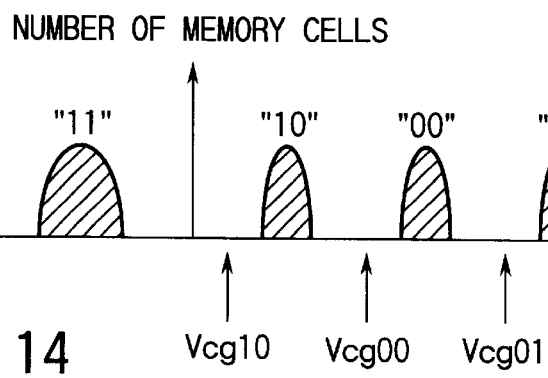
FIG. 14
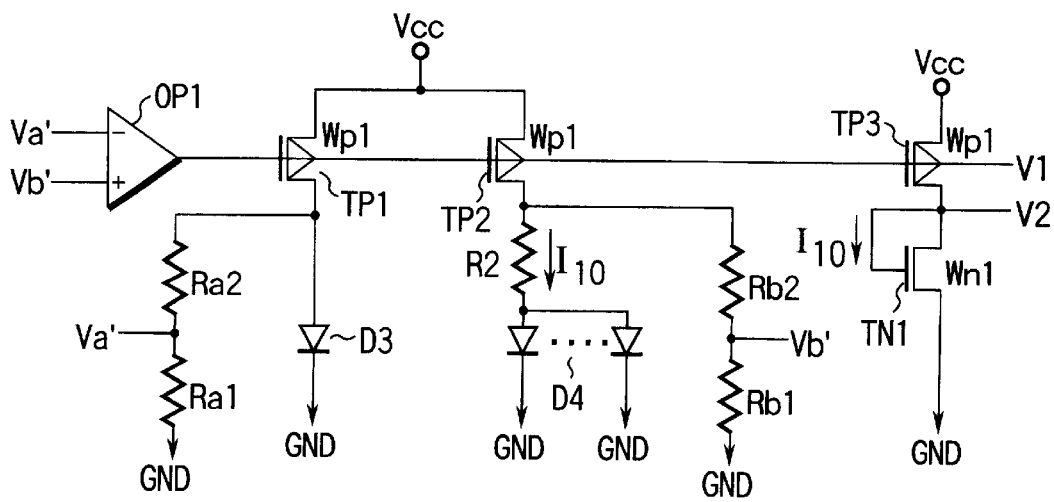
FIG. 15

VOLTAGE GENERATOR FOR COMPENSATING FOR TEMPERATURE DEPENDENCY OF MEMORY CELL CURRENT

CROSS-REFERENCE TO RELATED APPLICATIONS

This application is based upon and claims the benefit of priority from the prior Japanese Patent Application No. 11-207794, filed July 22, 1999, the entire contents of which are incorporated herein by reference.

BACKGROUND OF THE INVENTION

This invention relates to a voltage generator used for compensating for the temperature dependency of a memory cell current in a nonvolatile semiconductor memory device, for example.

In recent years, a NAND cell type EEPROM is proposed as one type of an electrically rewritable nonvolatile semiconductor memory device (EEPROM).

In the EEPROM, a plurality of memory cells with the n-channel MOSFET structure having, for example, a floating gate as a charge storage layer and a control gate stacked thereon are serially connected by commonly forming the sources and drains of every adjacent two of them, treated as one unit and connected to a bit line.

FIGS. 1A and 1B are a pattern plan view showing one NAND cell portion extracted from the memory cell array of the NAND cell type EEPROM and an equivalent circuit diagram thereof. FIGS. 2A and 2B are cross sectional views respectively taken along the 2A—2A line and 2B—2B line of the pattern of FIG. 1A.

The memory cell is formed in a p-type well region formed in a n-type well region which is formed in a p-type semiconductor substrate (for example, silicon substrate). A memory cell array formed of a plurality of NAND cells is formed in a portion of a silicon substrate (or p-type well region) 11 which is surrounded by an element isolating oxide film 12. In this case, attention is given to one NAND cell and it is explained. In this example, eight memory cells $M_1$ to $M_8$ are serially connected to construct one NAND cell. Each of the memory cells $M_1$ to $M_8$ is formed by forming a floating gate 14 ($14_1$, $14_2$, $14_3$, . . . $14_8$) on the substrate 11 with a gate insulating film 13 formed therebetween and stacking a control gate 16 ($16_1$, $16_2$, $16_3$, . . . $16_8$) on the floating gate 14 with a gate insulating film 15 disposed therebetween. Each n-type diffusion layer 19 ($19_1$, $19_2$, $19_3$, . . . $19_9$) which is used as the source or drain of the memory cell is commonly used by the two adjacent memory cells and thus the memory cells are serially connected.

On the drain side and source side of the NAND cell, first and second selection transistors $S_1$, $S_2$ are respectively formed. The selection transistors $S_1$, $S_2$ have first selection gates $14_9$, $16_9$ and second selection gates $14_{10}$, $16_{10}$ which are respectively formed at the same time as the floating gates and control gates of the memory cells are formed. The selection gates $14_9$, $16_9$ are electrically connected to each other in an area which is not shown in the drawing, the selection gates $14_{10}$, $16_{10}$ are also electrically connected to each other in an area which is not shown in the drawing, and the selection gates are respectively used as the gate electrodes of the selection transistors $S_1$, $S_2$. A portion of the substrate in which elements are formed is covered with a CVD oxide film 17 and a bit line 18 is formed on the CVD oxide film. The control gates 16 of the NAND cell are commonly arranged as control gate lines $CG_1$, $CG_2$, $CG_3$, . . . $CG_8$. The control gate lines are used as word lines. The selection gates $14_9$, $16_9$ and $14_{10}$, $16_{10}$ are also continuously arranged in a row direction as selection gate lines $SG_1$, $SG_2$.

FIG. 3 shows an equivalent circuit of a memory cell array obtained by arranging NAND cells having the same configuration as the NAND cell described above in a matrix form. The source lines are connected to one reference potential (Vs) wiring formed of Al, polysilicon or the like for every 64 bit lines via a contact hole, for example. The reference potential wiring is connected to peripheral circuits. The control gates and first, second selection gates of the memory cell are continuously arranged in the row direction. Generally, a set of memory cells connected to the control gate is called one page and a set of pages disposed between the drain-side (first selection gate) and source-side (second selection gate) selection gates of one set is called one NAND block or simply one block. For example, one page is constructed by memory cells of 256 bytes (256×8). The memory cells of one page are substantially simultaneously programmed. For example, one block is constructed by memory cells of 2048 bytes (2048×8). The memory cells of one block are substantially simultaneously erased.

FIG. 4 shows the threshold voltage distribution of the NAND cell in which "0" indicates a programmed state and "1" indicates an erased state.

With the above construction, the data readout operation is effected by setting the bit line to an electrically floating state after precharging the bit line to Vcc, setting the control gate of a selected memory cell to 0V, setting the control gates and selection gates of the other memory cells to a power supply voltage Vread (for example, 3.5V), setting the source line to 0V, and detecting a variation in the bit line potential to check whether or not a current flows into the selected memory cell. That is, if data programmed in the memory cell is "0" (the threshold voltage of the memory cell Vth>0), the memory cell is set into the OFF state, and therefore, the bit line is kept at the precharged potential. On the other hand, if data programmed in the memory cell is "1" (the threshold voltage of the memory cell Vth<0), the memory cell is set into the ON state so as to cause the bit line potential to be lowered from the precharged potential by ΔV. Data of the memory cell can be read out by detecting the bit line potential by use of a sense amplifier.

Further, in the data programming operation, 0V ("0" programming) or the power supply voltage Vcc ("1" programming) is applied to the bit line according to data to be programmed. The selection gate connected to the bit line is set to Vcc and the selection gate connected to the source line is set to 0V. At this time, 0V is transmitted to the channel of the cell in which "1" is programmed. At the time of "1" programming, since the selection gate connected to the bit line is turned OFF, the channel of the memory cell in which "1" is programmed is set to (Vcc-Vthsg (Vthsg is a threshold voltage of the selection gate)) and set into the electrically floating state. If the threshold voltage of the memory cell disposed nearer to the bit line side with respect to the memory cell in which data is to be programmed has a positive voltage Vthcell, the channel of the memory cell is set to (Vcc-Vthcell). After this, a boosted programming potential Vpgm (=approx. 20V) is applied to the control gate of the selected memory cell and an intermediate potential Vpass (=approx. 10V) is applied to the control gates of the non-selected memory cells. As a result, at the time of data "0", since the channel potential is set at 0V, a high voltage is applied between the floating gate and the substrate of the selected memory cell so as to cause electrons to be injected from the substrate into the floating gate by the tunneling effect and shift the threshold voltage in a positive direction. On the other hand, at the time of data "1", the channel set in the electrically floating state is set to an intermediate potential by the capacitive coupling with the control gate and no electrons are injected.

In the programming operation of the conventional NAND type flash memory, a verify read operation for checking whether or not the programming operation is sufficiently effected is effected after a programming pulse is applied. The re-programming operation is effected only for the memory cell in which the programming operation is detected to be insufficient by the verify read operation. The verify read operation is the same as the read operation described above except that the selected control gate is not set to 0V but is set to a potential Vvry (for example, 0.5V) as shown in FIG. 4. The reason why the control gate is set to the potential Vvry which is higher than 0V is to acquire an operation margin of the read operation by programming the memory cell to a sufficiently high threshold voltage.

The data erasing operation is effected substantially simultaneously for each block. That is, all of the control gates of the block which is subjected to the erasing process are set to 0V and a boosted potential Vera (approx. 20V) is applied to the p-type well region and n-type well region. The potential of the control gates of the block which is not subjected to the erasing process is raised from the potential set in the electrically floating state to the potential Vera set by the capacitive coupling with the p-type well region. As a result, electrons in the floating gate of the memory cell in the block subjected to the erasing process are discharged into the p-type well region to shift the threshold voltage in a negative direction. Since both of the control gate and p-type well region are set at the boosted potential Vera in the block which is not subjected to the erasing process, the erasing operation is not effected.

In the conventional NAND type flash memory described above, a constant voltage is applied from a constant voltage generator to the control gate of the selected memory cell in the read operation or verify read operation. However, at this time, a current flowing through the memory cell varies depending on a temperature change. Therefore, the threshold voltage of the memory cell which varies depending on a temperature change is read and, as a result, there occurs a problem that the threshold voltage distribution is spread.

BRIEF SUMMARY OF THE INVENTION

Accordingly, an object of this invention is to provide a voltage generator capable of reducing an influence due to a temperature variation.

Further, another object of this invention is to provide a voltage generator capable of suppressing the spreading of the threshold voltage distribution of memory cells due to a temperature variation in a nonvolatile semiconductor memory device.

The above object can be attained by a voltage generator comprising a first terminal acting as an output terminal; a constant current source connected to the first terminal, for supplying or discharging a constant current which is substantially independent of a temperature change to or from the first terminal; a temperature-dependent current source connected to the first terminal, for supplying or discharging a temperature-dependent current which changes as temperature varies to or from the first terminal; and a first current/voltage converter connected to the first terminal.

The above object can be attained by a voltage generator comprising a first terminal acting as an output terminal; a first constant current source connected to the first terminal, for supplying a first constant current which is substantially independent of a temperature change to the first terminal; a second constant current source connected to the first terminal, for discharging a second constant current which is substantially independent of a temperature change from the first terminal; a first temperature-dependent current source connected to the first terminal, for supplying a first temperature-dependent current which changes as temperature varies to the first terminal; a second temperature-dependent current source connected to the first terminal, for discharging a second temperature-dependent current which changes temperature varies from the first terminal; and a first current/voltage converter connected to the first terminal.

Further, the above object can be attained by a voltage generator comprising a first terminal acting as an output terminal; a first constant current source connected to the first terminal, for supplying a constant current which is substantially independent of a temperature change to the first terminal; a first temperature-dependent current source connected to the first terminal, for discharging a temperature-dependent current which changes as temperature varies from the first terminal; and a first current/voltage converter connected to sad first terminal.

The above object can be attained by a voltage generator comprising a first terminal acting as an output terminal; a constant current source connected to the first terminal, for supplying or discharging a constant current which is substantially independent of a temperature change to or from the first terminal; a temperature-dependent current source connected to the first terminal, for supplying a temperature-dependent current which changes as temperature varies to the first terminal; and a first current/voltage converter connected to the first terminal.

Further, the above object can be attained by a voltage generator comprising a voltage generating circuit for generating a predetermined voltage; and a circuit for changing the temperature dependency of the predetermined voltage.

The above object can be attained by a voltage generator comprising a voltage generating circuit for generating a predetermined voltage; and a circuit for changing a value of the predetermined voltage with the amount of change of the predetermined voltage as a temperature changes kept constant.

Thus, according to this invention, a voltage generator capable of suppressing an influence due to the temperature change can be provided and a voltage generator capable of suppressing the spreading of the threshold voltage distribution of the memory cells due to a temperature change in a nonvolatile semiconductor memory device can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a pattern plan view showing one NAND cell portion extracted from a memory cell array of a NAND cell type EEPROM;

FIG. 1B is an equivalent circuit diagram of one NAND cell portion extracted from a memory cell array of a NAND cell type EEPROM;

FIG. 13 is a diagram collectively showing the output voltage-temperature characteristics of various potentials derived in the circuits shown in FIGS. 10A and 10B to FIGS. 12A and 12B;

FIG. 14 is a diagram for illustrating the relation between the threshold voltage distribution of four-value memory cells and various potentials derived in the circuits shown in FIGS. 10A and 10B to FIGS. 12A and 12B;

FIG. 15 is a circuit diagram showing another example of the construction of the current generating circuit for generating a current varying in proportion to a temperature change shown in FIG. 6A;

DETAILED DESCRIPTION OF THE INVENTION

First Embodiment

Figure 5:
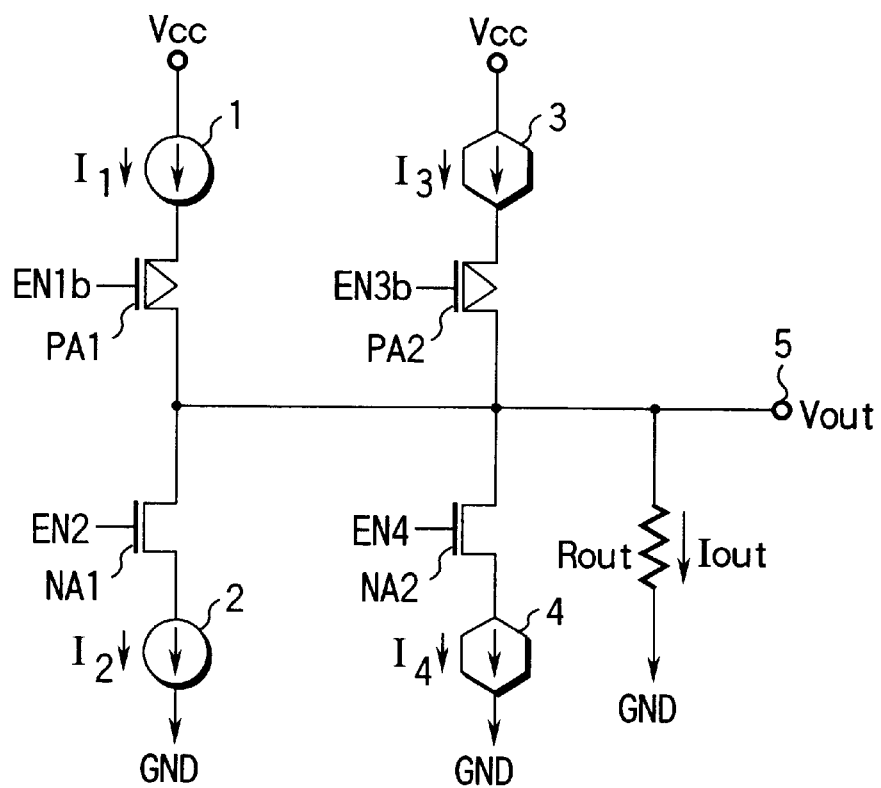
FIG. 5 is a conceptual diagram for illustrating a voltage generator of this invention.

FIG. 5 is a conceptual diagram for illustrating a voltage generator of this invention.

The voltage generator includes current sources 1, 2 for generating constant currents independent of a temperature change, current sources 3, 4 for generating currents varying in proportion to the temperature change, P-channel MOS transistors PA1, PA2, N-channel MOS transistors NA1, NA2 and resistor Rout.

The current source 1 and the current path of the MOS transistor PA1 are serially connected between a power supply Vcc and an output terminal 5 and an enable signal EN1b is supplied to the gate of the MOS transistor PA1. The current path of the MOS transistor NA1 and the current source 2 are serially connected between the output terminal 5 and a ground node GND and an enable signal EN2 is supplied to the gate of the MOS transistor NA1. Further, the current source 3 and the current path of the MOS transistor PA2 are serially connected between the power supply Vcc and the output terminal 5 and an enable signal EN3b is supplied to the gate of the MOS transistor PA2. The current path of the MOS transistor NA2 and the current source 4 are serially connected between the output terminal 5 and the ground node GND and an enable signal EN4 is supplied to the gate of the MOS transistor NA2. Further, the resistor Rout used as a current/voltage converter is connected between the output terminal 5 and the ground node GND. In FIG. 5, the resistor is used as the current/voltage converter, but a MOS transistor can be used, for example.

It is supposed that a current flowing through the current source 1 and independent of the temperature change is $I_1$, a current flowing through the current source 2 and independent of the temperature change is $I_2$, a current flowing through the current source 3 and varying in proportion to the temperature change is $I_3$, a current flowing through the current source 4 and varying in proportion to the temperature change is $I_4$, and a current flowing through the resistor Rout is $I_{out}$.

Next, the operation of the voltage generator with the above construction is explained.

(1) A case wherein a positive temperature characteristic is given:

In this case, the enable signals EN1b, EN2, EN3b, EN4 are set to the low ("L") level. As a result, since the MOS transistors PA1, PA2 are set into the ON state and the MOS transistors NA1, NA2 are set into the OFF state, the current $I_{out}$ flowing through the resistor Rout is expressed as follows.

$$I_{out}=I_1+I_3.$$

Therefore, the output voltage Vout becomes as follows.

$$Vout=Rout \times I_{out}=Rout(I_1+I_3)$$

That is, the output voltage becomes a voltage which varies in proportion to the temperature change with respect to the voltage value Rout·$I_1$.

Alternatively, it is possible to set the enable signals EN3b, EN4 to the "L" level and set the enable signals EN1b, EN2 to a high ("H") level. In this case, the current $I_{out}$ flowing through the resistor Rout is expressed as follows.

$$I_{out}=I_3-I_2.$$

Therefore, the output voltage Vout becomes as follows.

$$Vout=Rout \times I_{out}=Rout(I_3-I_2)$$

Also, in this case, the output voltage becomes a voltage which increases in proportion to the temperature change with respect to a desired voltage value.

(2) A case wherein a negative temperature characteristic is given:

In this case, the enable signals EN1b, EN2 are set to the "L" level and the enable signals EN3b, EN4 are set to the "H" level. As a result, since the MOS transistors PA1, NA2 are set into the ON state and the MOS transistors NA1, PA2 are set into the OFF state, the current $I_{out}$ flowing through the resistor Rout is expressed as follows.

$$I_{out}=I_1-I_4.$$

Therefore, the output voltage Vout becomes as follows.

$$Vout=Rout \times I_{out}=Rout(I_1-I_4)$$

That is, the output voltage becomes a voltage which decreases in proportion to a temperature change with respect to the voltage value Rout·$I_1$.

(3) A case wherein the temperature dependency is eliminated:

In this case, the enable signals EN1b, EN2, EN4 are set to the "L" level and the enable signal EN3b is set to the "H" level. As a result, since the MOS transistor PA1 is set into the ON state and the MOS transistors NA1, NA2, PA2 are set into the OFF state, the current $I_{out}$ flowing through the resistor Rout is expressed as follows.

$$I_{out}=I_1.$$

Therefore, the output voltage Vout becomes as follows.

$$Vout=Rout \times I_{out}=Rout \cdot I_1$$

That is, the output voltage is independent of the temperature change.

EXAMPLE

Figure 6A:
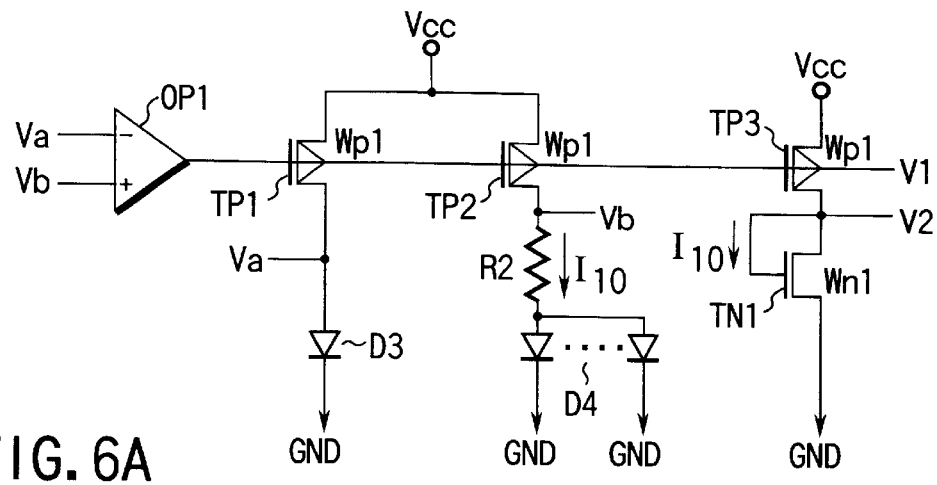
FIG. 6A is a circuit diagram showing an example of the concrete construction of the circuit shown in FIG. 5 and showing a current generating circuit for generating a current varying in proportion to a temperature change.

Next, this invention is described more in detail by use of an example of the concrete circuit of the voltage generator. FIG. 6A shows a current generating circuit for generating a current varying in proportion to a temperature change. The circuit includes an operational amplifier OP1, P-channel MOS transistors TP1 to TP3, N-channel MOS transistor TN1, resistor R2 and diodes D3, D4. A potential Va is applied to the inverting input terminal (−) of the operational amplifier OP1 and a potential Vb is applied to the non-inverting input terminal (+) thereof. The output terminal of the operational amplifier OP1 is connected to the gates of the MOS transistors TP1 to TP3. The sources of the MOS transistors TP1, TP2 are connected to the power supply Vcc, the anode of the diode D3 is connected to the drain of the MOS transistor TP1, and one end of the resistor R2 is connected to the drain of the MOS transistor TP2. The cathode of the diode D3 is connected to the ground node GND and the potential Va on the anode side thereof is applied to the inverting input terminal (−) of the operational amplifier OP1. The anodes of the N diodes D4 are connected to the other end of the resistor R2 and the cathodes of the diodes D4 are connected to the ground node GND. The potential Vb on the one-end side of the resistor R2 is supplied to the non-inverting input terminal (+) of the operational amplifier OP1.

The source of the MOS transistor TP3 is connected to the power supply Vcc and the drain thereof is connected to the drain and gate of the MOS transistor TN1. The source of the MOS transistor TN1 is connected to the ground node GND. The potential of the output terminal of the operational amplifier OP1 is output as V1 and the potential of the drain common connection node of the MOS transistors TP3, TN1 is output as V2.

With the above construction, the potential V1 is controlled by the operational amplifier OP1 so that the potentials Va and Vb will become equal to each other. At this time, a current $I_{10}$ flowing through the resistor R2 is expressed as follows.

$$I_{10} = (VT/R2) \times \ln N \qquad (1)$$

where VT=kT/q (k is the Bolzmann's constant, q is the charge amount of an electron, T is an absolute temperature).

As is clearly understood from the equation (1), the current $I_{10}$ varies in proportion to the absolute temperature T. Further, the current $I_{10}$ is a stable current which is independent of the power supply voltage Vcc, the threshold voltages of the MOS transistors and the like.

Figure 6B:
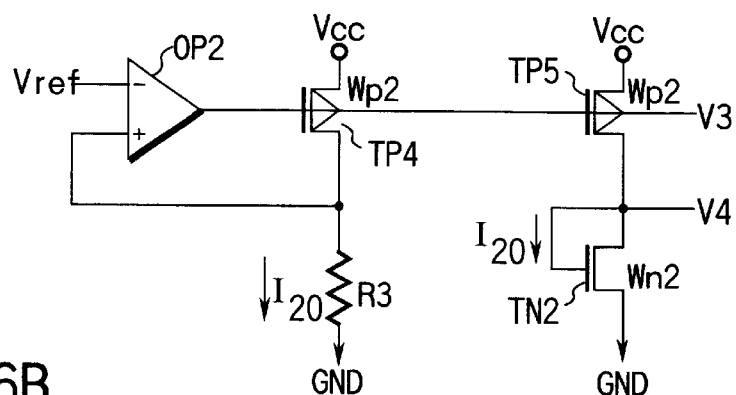
FIG. 6B is a circuit diagram showing an example of the concrete construction of the circuit shown in FIG. 5 and showing a constant current generating circuit for generating a current which is independent of a temperature change.

FIG. 6B shows a constant current generating circuit for generating a constant current which is independent of a temperature change. The circuit includes an operational amplifier OP2, P-channel MOS transistors TP4, TP5, N-channel MOS transistor TN2 and resistor R3. A reference potential Vref is applied to the inverting input terminal (−) of the operational amplifier OP2 whose output terminal is connected to the gates of the MOS transistors TP4, TP5. The source of the MOS transistor TP4 is connected to the power supply Vcc and the drain thereof is connected to the non-inverting input terminal (+) of the operational amplifier OP2 and one end of the resistor R3. The other end of the resistor R3 is connected to the ground node GND.

The source of the MOS transistor TP5 is connected to the power supply Vcc and the drain thereof is connected to the drain and gate of the MOS transistor TN2. The source of the MOS transistor TN2 is connected to the ground node GND. The potential of the output terminal of the operational amplifier OP2 is output as V3 and the potential of the drain common connection node of the MOS transistors TP5, TN2 is output as V4.

Figure 7:
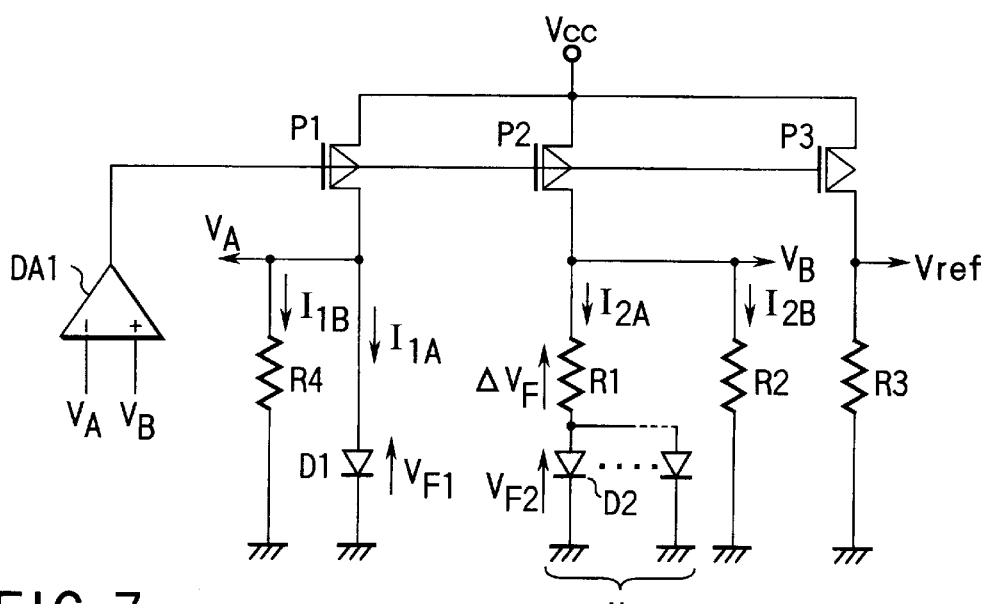
FIG. 7 is a circuit diagram showing a band gap reference circuit for generating a reference potential.

The reference potential Vref is a voltage which is independent of the temperature change, the power supply voltage Vcc, the threshold voltages of the MOS transistors and the like and is created by use of a band gap reference circuit shown in FIG. 7, for example. The circuit is disclosed in Banba et al., VLSI Symposium 98 Digest of Technical Papers P. 228 to 229 and detail information on the circuit can be obtained by referring to the above document. A current $I_{20}$ flowing through the resistor R3 in the circuit shown in FIG. 7 is expressed as follows.

$$I_{20} = Vref/R3$$

Since Vref is independent of a temperature change, $I_{20}$ becomes a constant current which is independent of a temperature change, power supply voltage, the threshold voltages of the transistors and the like.

Figure 8:
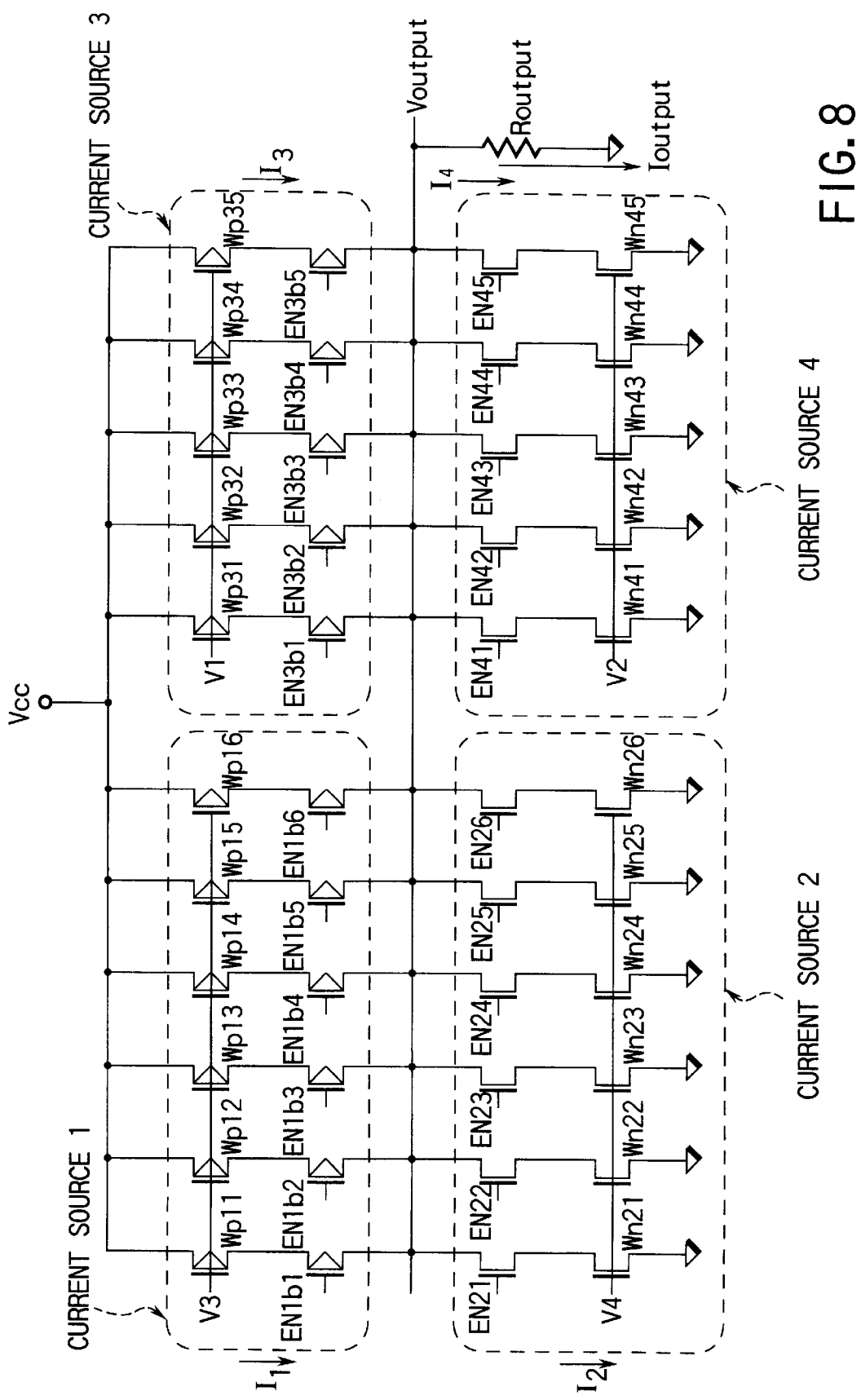
FIG. 8 is a circuit diagram showing a circuit for deriving the sum/difference of a current varying in proportion to a temperature change and a current independent of the temperature change.

FIG. 8 shows a circuit for deriving the sum/difference of a current varying in proportion to a temperature change and a current independent of the temperature change. The gate potential of P-channel MOS transistors Wp11 to Wp16 in the current source 1 is the potential V3 generated from the constant current source (FIG. 6B) which is independent of the temperature change. Thus, the current source 1 supplies the current $I_1$ which is independent of the temperature change. The magnitude of the current $I_1$ is determined by the total sum of the channel widths of the MOS transistors which are set in the ON state in the current source 1. For example, if only the enable signal EN1b1 is set to the "L" level and the other enable signals EN1b2, EN1b3, . . . , EN1b6 are set to the "H" level, then the current $I_1$ is set to a value as follows.

$$I_1 = (Wp11/Wp2) \times I_{20} = (Wp11/Wp2) \times (Vref/R3)$$

Further, if the enable signals EN1b1, EN1b2, EN1b3 are set to the "L" level and the other enable signals EN1b4, EN1b5, EN1b6 are set to the "H" level, then the current $I_1$ is set to a value as follows.

$$I_1 = [(Wp11 + Wp12 + Wp13)/Wp2] \times I_{20}$$
$$= [(Wp11 + Wp12 + Wp13)/Wp2] \times (Vref/R3)$$

Thus, the current of a desired value which is independent of a temperature change can be supplied by selectively setting the enable signals EN1b1, EN1b2, EN1b3, . . . , EN1b5, EN1b6 to the "H" level/"L" level.

Likewise, the potential V4 generated from the circuit shown in FIG. 6B is supplied to the gates of N-channel MOS transistors Wn21 to Wn26 in the current source 2 and a current $I_2$ which is independent of the temperature change is discharged to the ground node GND. The magnitude of the current $I_2$ is determined by the total sum of the channel widths of the MOS transistors which are set in the ON state in the current source 2. For example, if only the enable signal EN21 is set to the "H" level and the other enable signals EN22, EN23, . . . , EN26 are set to the "L" level, then the current $I_2$ is set to a value as follows.

$$I_2 = (Wn21/Wn2) \times I_{20} = (Wn21/Wn2) \times (Vref/R3)$$

Further, if the enable signals EN22, EN23 are set to the "H" level and the other enable signals EN21, EN24, EN25, EN26 are set to the "L" level, then the current $I_2$ is set to a value as follows.

$$I_2 = [(Wn22 + Wn23)/Wn2] \times I_{20}$$
$$= [(Wn22 + Wn23)/Wn2] \times (Vref/R3)$$

Thus, the current of a desired value which is independent of a temperature change can be supplied by selectively setting the enable signals EN21, EN22, . . . , EN25, EN26 to the "H" level/"L" level.

Since the gate potential of P-channel MOS transistors Wp31 to Wp35 in the current source 3 is the potential V1 generated from the current generating circuit (FIG. 6A) which varies in proportion to a temperature change, the current source 3 supplies the current $I_3$ which varies in proportion to the temperature change. The magnitude of the current $I_3$ is determined by the total sum of the channel widths of the MOS transistors which are set in the ON state in the current source 3. For example, if only the enable signal EN3b1 is set to the "L" level and the other enable signals EN3b2, EN3b3, . . . , EN3b5 are set to the "H" level, then the current $I_3$ is set to a value as follows.

$$I_3 = (Wp31/Wp1) \times I_{10}$$
$$= (Wp31/Wp1) \times (VT/R2) \times \ln N$$

Further, if the enable signals EN3b1, EN3b2 are set to the "L" level and the other enable signals EN3b3, EN3b4, EN3b5 are set to the "H" level, then the current $I_3$ is set to a value as follows.

$$I_3 = [(Wp31 + Wp32)/Wp1] \times I_{10}$$
$$= [(Wp31 + Wp32)/Wp1] \times (VT/R2) \times \ln N$$

Thus, the current of a desired value which varies in proportion to a temperature change can be supplied by selectively setting the enable signals EN3b1, EN3b2, ..., EN3b5 to the "H" level/"L" level.

Likewise, the potential V2 generated from the circuit shown in FIG. 6A is supplied to the gates of N-channel MOS transistors Wn41 to Wn45 in the current source 4 and a current $I_4$ which varies in proportion to a temperature change is discharged. The magnitude of the current $I_4$ is determined by the total sum of the channel widths of the MOS transistors which are set in the ON state in the current source 4. For example, if only the enable signal EN41 is set to the "H" level and the other enable signals EN42, EN43, ..., EN45 are set to the "L" level, then the current $I_4$ is set to a value as follows.

$$I_4 = (Wn41/Wn1) \times I_{10}$$
$$= (Wn41/Wn1) \times (VT/R2) \times \ln N$$

Further, if the enable signals EN41, EN42 are set to the "H" level and the other enable signals EN43, EN44, EN45 are set to the "L" level, then the current $I_4$ is set to a value as follows.

$$I_4 = [(Wn41 + Wn42)/Wn1] \times I_{10}$$
$$= [(Wn41 + Wn42)/Wn1] \times (VT/R2) \times \ln N$$

Thus, the current of a desired value which varies in proportion to a temperature change can be supplied by selectively setting the enable signals EN41, EN42, ..., EN45 to the "H" level/"L" level.

Next, the operations of the circuits shown in FIGS. 6A, 6B, 7 and 8 are explained.

(1) A case wherein a positive temperature characteristic is given:

The enable signals EN21, EN22, EN23, ..., EN26 and enable signals EN41, EN42, EN43, ..., EN45 are set to the "L" level in the circuit shown in FIG. 8 to turn OFF all of the MOS transistors in the current sources 2, 4 which are supplied with the above enable signals at the gates thereof. Further, the enable signals EN1b1, EN1b2, EN1b3, ..., EN1b6 and enable signals EN3b1, EN3b2, EN3b3 ..., EN3b5 are set to the "L" level to turn ON all of the MOS transistors in the current sources 1, 3 which are supplied with the above enable signals at the gates thereof, and as a result, a current $I_{output}$ flowing through the resistor Routput is obtained as follows.

$$I_{output} = I_1 + I_3$$

As a result, an output voltage Voutput expressed as follows is obtained.

$$\text{Voutput} = \text{Routput} \times I_{output} = (I_1 + I_3) \times \text{Routput}$$

That is, the output voltage Voutput becomes a voltage which varies in proportion to a temperature change with respect to the voltage value Routput·$I_1$. Voutput is a function of the ratio of the resistor elements (for example, Rout/R2). Therefore, even if the resistances of the resistance elements are changed due to a variation in the process or temperature change, the output voltage Voutput is not varied.

As described above, the value of the current $I_1$ can be variously set by selectively setting the enable signals EN1b1, EN1b2, ..., EN1b5, EN1b6 to the "H" level/"L" level and the value of the current $I_3$ can be variously set by selectively setting the enable signals EN3b1, EN3b2, ..., EN3b5 to the "H" level/"L" level. As a result, the voltage Voutput which can be set to various magnitudes and have various positive temperature characteristics can be obtained.

Alternatively, by setting the enable signals EN1b1, EN1b2, ..., EN1b6 to the "H" level and setting the enable signals EN41, EN42, ..., EN45 to the "L" level in FIG. 8, all of the MOS transistors in the current sources 1, 4 whose gates are supplied with the above enable signals can be turned OFF. By turning ON the MOS transistors in the current sources 2, 3, the current $I_{output}$ flowing through the resistor Routput can be expressed as follows.

$$I_{output} = I_3 - I_2$$

Therefore, the output voltage Voutput can be expressed as follows.

$$\text{Voutput} = \text{Routput} \times I_{output} = \text{Routput}(I_3 - I_2)$$

Also, in this case, since the values of $I_2$, $I_3$ can be set to various values by changing the total sum of the channel widths of the MOS transistors which are set into the ON states in the current sources 2, 3, the voltage Voutput of various values having various positive temperature characteristics can be obtained.

(2) A case wherein a negative temperature characteristic is given:

By setting the enable signals EN21, EN22, EN23, ..., EN26 to the "L" level and setting the enable signals EN3b1, EN3b2, EN3b3, ..., EN3b5 to the "H" level in the circuit shown in FIG. 8, all of the MOS transistors in the current sources 2, 3 whose gates are supplied with the above enable signals are set into the OFF state. By turning ON the MOS transistors in the current sources 1, 4, the current $I_{output}$ flowing through the resistor Routput can be expressed as follows.

$$I_{output} = I_1 - I_4$$

Therefore, the output voltage Voutput can be expressed as follows.

$$\text{Voutput} = \text{Routput} \times I_{output} = \text{Routput}(I_1 - I_4)$$

That is, the output voltage Voutput is set to a voltage which decreases in proportion to a temperature change with respect to the voltage value Routput·$I_1$.

As described above, the value of the current $I_1$ can be variously set by selectively setting the enable signals EN1b1, EN1b2, ..., EN1b5, EN1b6 to the "H" level/"L" level and the value of the current $I_4$ can be variously set by selectively setting the enable signals EN41, EN42, ..., EN45 to the "H" level/"L" level. As a result, the voltage Voutput having various values and various negative temperature characteristics can be obtained.

(3) A case wherein the temperature dependency is eliminated:

By setting the enable signals EN21, EN22, EN23, ..., EN26 and enable signals EN41, EN42, EN43, ..., EN45 to the "L" level and setting the enable signals EN3b1, EN3b2, EN3b3, ..., EN3b5 to the "H" level in the circuit shown in FIG. 8, all of the MOS transistors in the current sources 2, 3, 4 whose gates are supplied with the above enable signals are set into the OFF state. By turning ON the MOS transistors in the current source 1, the current $I_{output}$ flowing through the resistor Routput can be expressed as follows.

$I_{output}=I_1$

Therefore, the output voltage Voutput can be expressed as follows.

$Voutput=Routput \times I_{output}=Routput \cdot I_1$

That is, the output voltage Voutput is independent of a temperature change.

As described above, the value of the current $I_1$ can be variously set by selectively setting the enable signals EN1b1, EN1b2, . . . , EN1b5, EN1b6 to the "H" level/"L" level. As a result, the voltage Voutput which has various values and is independent of a temperature change can be obtained.

Since the current generated in the current generating circuit shown in FIGS. 6A and 6B does not depend on the power supply voltage Vcc and the threshold voltages of the MOS transistors, the output voltage Voutput generated by the circuit shown in FIG. 8 becomes a stable voltage which does not depend on the power supply voltage Vcc and the threshold voltages of the MOS transistors.

Figure 9A:
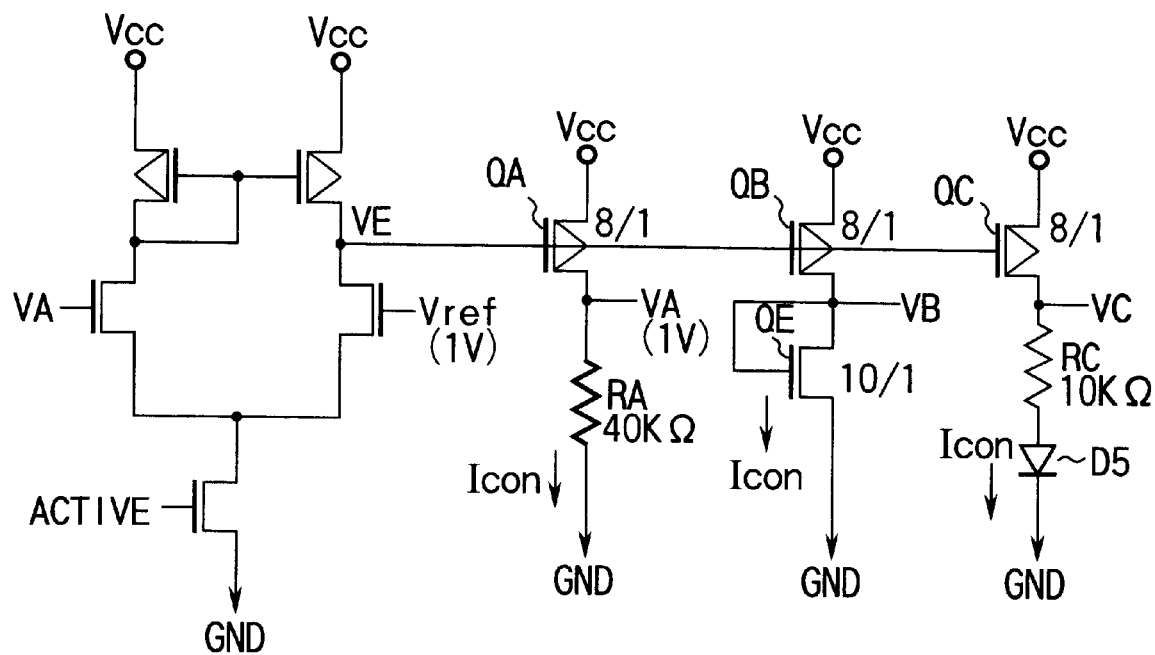
FIG. 9A is a circuit diagram showing an example of a circuit for generating a constant current independent of a temperature change, for illustrating another construction of the constant current generating circuit shown in FIGS. 6A and 6B.
Figure 9B:
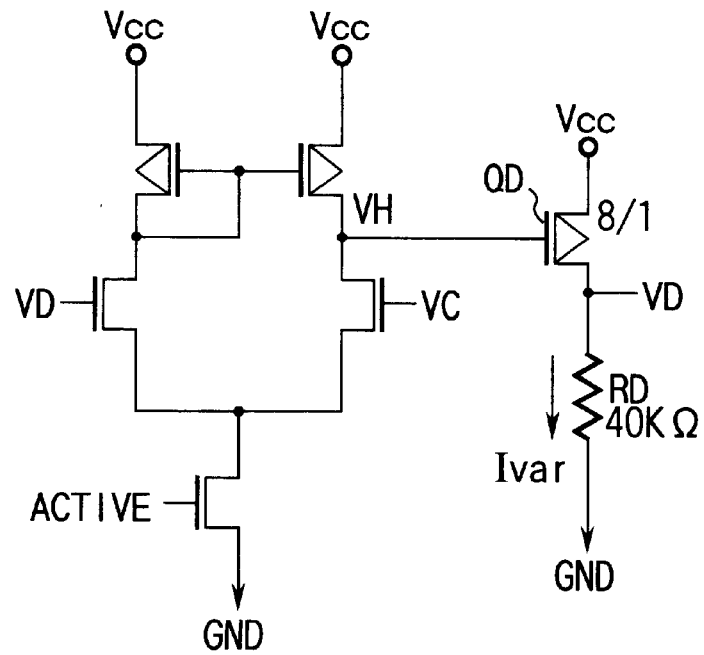
FIG. 9B is a circuit diagram showing an example of a circuit for generating a current which decreases with a temperature change, for illustrating another construction of the constant current generating circuit shown in FIGS. 6A and 6B.

FIGS. 9A and 9B are circuit diagrams for illustrating other examples of the constructions of the current generating circuit and the constant current generating circuit shown in FIGS. 6A and 6B.

"ACTIVE" is an operational amplifier activating signal which is set at a Vdd (power supply voltage or chip internal power supply voltage) level during the operation. "Vref" is a constant voltage (1V) which is generated from the band gap reference circuit and is independent of a temperature change. The circuit of FIG. 9A generates a constant current $I_{con}$ which is independent of the temperature change and the circuit of FIG. 9B generates a current $I_{var}$ which decreases in proportion to the temperature change. In FIGS. 9A and 9B, since a potential VA is controlled to be set equal to the reference potential Vref, the constant current $I_{con}$ can be expressed as follows.

$I_{con}=Vref/RA$

Thus, the constant current $I_{con}$ becomes a constant current which is independent of the temperature change. Further, a current flowing through the diode D5 is constant. In this case, a potential VC decreases in proportion to a temperature change.

That is, VC can be expressed as follows.

$VC=B1-B2 \times T$ where B1, B2 are constants.

Since a potential VD is controlled so as to be set equal to the potential VC, the current $I_{var}$ can be expressed as follows.

$I_{var}=VD/RD=VC/RD=C1-C2 \times T$ where C1, C2 are constants.

Thus, by subjecting the currents $I_{con}$ and $I_{var}$ to the adding/subtracting operation, a current of a desired absolute value which decreases or increases in proportion to the temperature change can be obtained.

In the circuits shown in FIGS. 9A and 9B, if the channel width/channel length ratios of P-channel MOS transistors QA, QB, QC, QD are set to 8/1, the channel width/channel length ratio of an N-channel MOS transistor QE is set to 10/1, the resistance of the resistor RA is set to 40 kΩ, the resistance of the resistor RC is set to 10 kΩ and the resistance of the resistor RD is set to 40 kΩ, then the current $I_{con}$ becomes approx. 25 µA.

Further, in the circuit of FIG. 9A, it is possible to omit the resistor RC. The resistor RC is inserted to enhance the voltage VC so that the P-channel MOS transistor QC will be operated in a saturated region.

FIGS. 10A and 10B to FIGS. 12A and 12B are circuit diagrams for illustrating cases wherein various voltages having the same temperature dependency are generated by subjecting the currents $I_{con}$ and $I_{var}$ generated in the circuits of FIGS. 9A and 9B to the adding/subtracting operation. In FIGS. 10A and 10B to FIGS. 12A and 12B, Vcg10 indicates a word line voltage for reading a "10" 1 state in FIG. 14, Vcg00 indicates a word line voltage for reading a "00", state and Vcg01 indicates a word line voltage for reading a "01" state. FIG. 14 shows a threshold voltage distribution obtained when 2-bit (four-value) data is stored in one memory cell, and "11" indicates an erased state and "10", "00", "01" indicate programmed states.

Figure 10A:
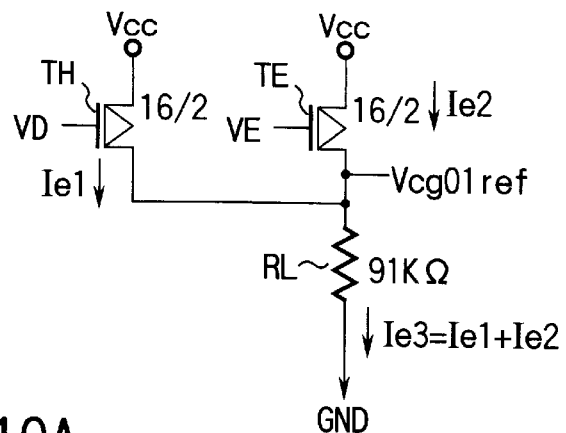
FIG. 10A is a circuit diagram showing a current adding/subtracting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.
Figure 10B:
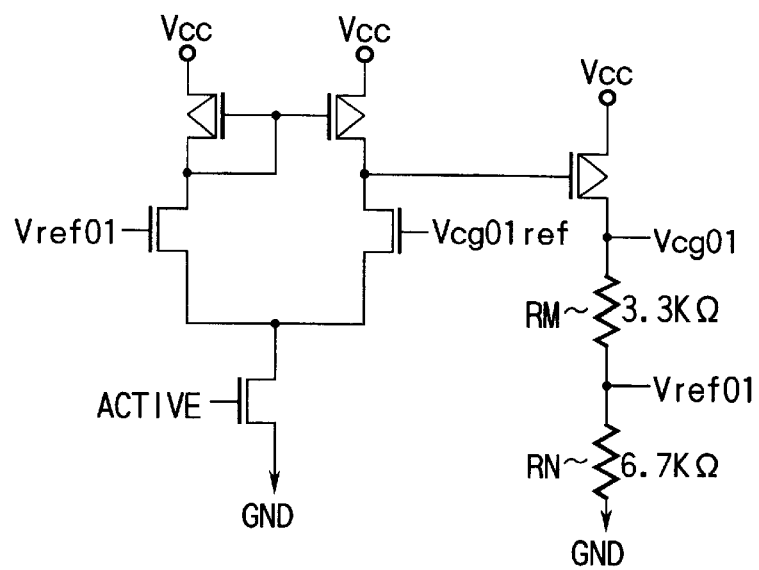
FIG. 10B is a circuit diagram showing a DC-DC converting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.

As shown in FIGS. 10A and 10B, if the channel width/channel length ratios of P-channel MOS transistors TH, TE are set to 16/2 and the resistance of a load resistor RL is set to 91 kΩ, a current Ie3 flowing through the load resistor RL becomes equal to the sum (Ie3=Ie1+Ie2) of a current Ie1 which is proportional to $I_{var}$ and a current Ie2 which is proportional to $I_{con}$. In this case, the resistance of a resistor RM in a DC-DC converter (FIG. 10B) for outputting the word line voltage Vcg01 is set to 3.3 kΩ and the resistance of a resistor RN is set to 6.7 kΩ.

Figure 11A:
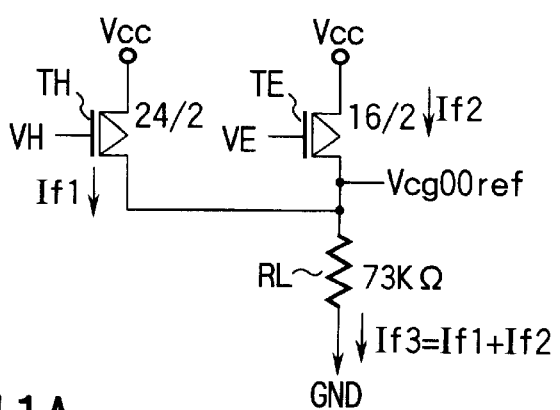
FIG. 11A is a circuit diagram showing a current adding/subtracting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.
Figure 11B:
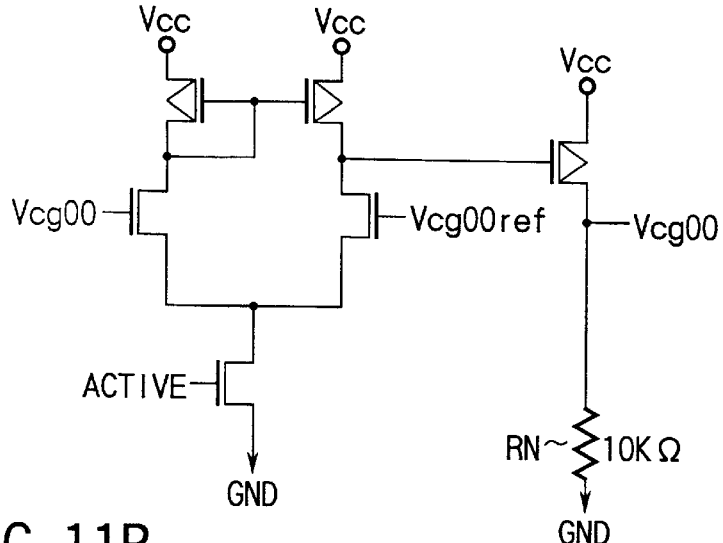
FIG. 11B is a circuit diagram showing a DC-DC converting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.

As shown in FIGS. 11A and 11B, if the channel width/channel length ratio of the P-channel MOS transistor TH is set to 24/2, the channel width/channel length ratio of the P-channel MOS transistor TE is set to 16/2 and the resistance of the load resistor RL is set to 73 kΩ, then a current If3 flowing through the load resistor RL becomes equal to the sum (If3=If1+If2) of a current If1 which is proportional to $I_{var}$ and a current If2 which is proportional to $I_{con}$. In this case, the word line voltage Vcg00 is set to Vcg00ref.

Figure 12A:
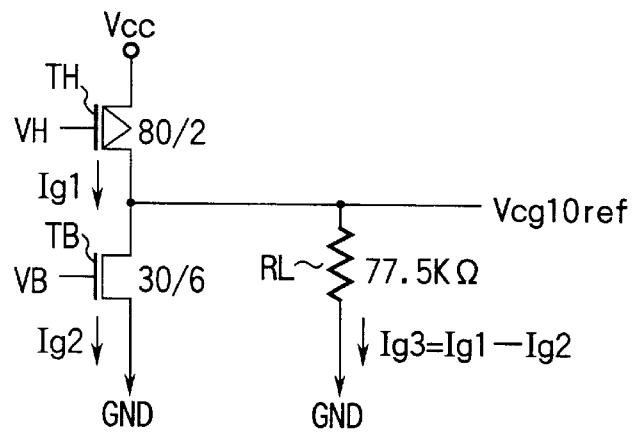
FIG. 12A is a circuit diagram showing a current adding/subtracting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.
Figure 12B:
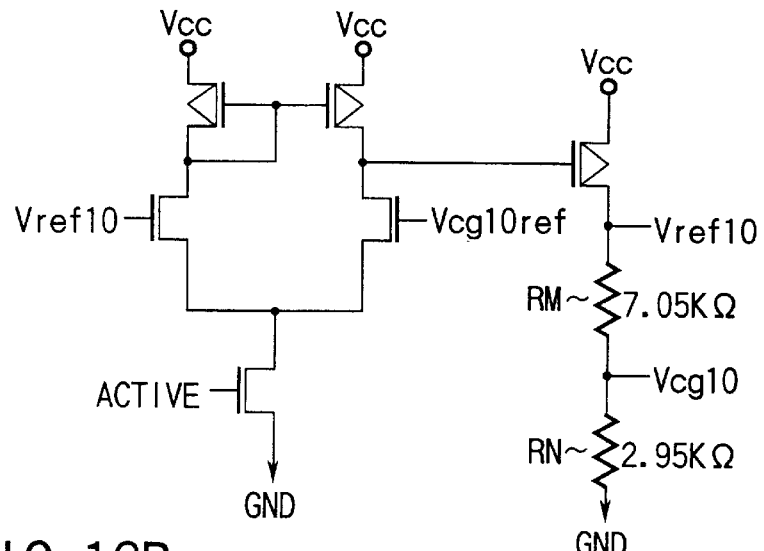
FIG. 12B is a circuit diagram showing a DC-DC converting circuit, for illustrating a case wherein various voltages having the same temperature dependency are generated by effecting the adding/subtracting operation for the constant current independent of a temperature change and the current decreasing in proportion to the temperature change which are generated in the circuits shown in FIGS. 9A and 9B.

As shown in FIGS. 12A and 12B, if the channel width/channel length ratio of the P-channel MOS transistor TH is set to 80/2, the channel width/channel length ratio of an N-channel MOS transistor TB is set to 30/6 and the resistance of the load resistor RL is set to 77.5 kΩ, then a current Ig3 flowing through the load resistor RL becomes equal to the difference (Ig3=Ig$_1$-Ig2) between a current Ig1 which is proportional to $I_{var}$ and a current Ig2 which is proportional to $I_{con}$. In this case, the resistance of the resistor RM in a DC-DC converter (FIG. 12B) for outputting the word line voltage Vcg10 is set to 7.05 kΩ and the resistance of the resistor RN is set to 2.95 kΩ.

In the circuits shown in FIGS. 10A and 10B to FIGS. 12A and 12B, the potentials Vcg01, Vcg00, Vcg10 are generated by subjecting the output voltages Vcg01ref, Vcg00ref, Vcg10ref of the current adding/subtracting circuits to the DC-DC converting operation. The potentials Vcg01, Vcg00, Vcg10 are applied to the word line of the memory cell.

The output voltage-temperature characteristics of the potentials Vcg01ref, Vcg00ref, Vcg10ref, Vcg01, Vcg00, Vcg10 are collectively shown in FIG. 13. As is clearly seen from FIG. 13, the potentials Vcg01, Vcg00, Vcg10 all indicate the same temperature dependency. Since the temperature dependency of the threshold voltage of the memory cell is the same in the states "10", "00", "01", the temperature dependency of the threshold voltage of the memory cell in all of the states "10", "00", "01" can be compensated for by use of the voltage generator of this embodiment. Further, in this embodiment, the values of the potentials Vcg01ref, Vcg00ref, Vcg10ref are set in a narrow range of 0.7V to 1.01V as is clearly seen from FIG. 13. That is, in the circuits shown in FIGS. 10A to 12A, since the MOS transistors TH, TE, TB whose gates are applied with the potentials VH, VE, VB are always set into the saturated region, the stable operation can be attained.

Figure 16A:
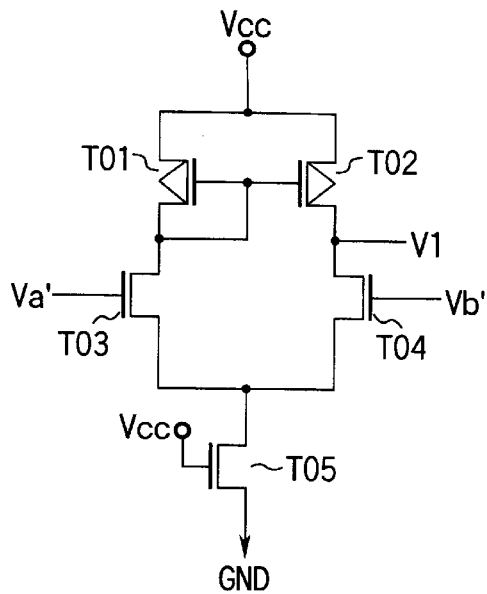
FIG. 16A is a circuit diagram showing a first example of a circuit construction suitable for operational amplifiers in the circuits shown in FIGS. 6A, 6B, 7 and 15.
Figure 16B:
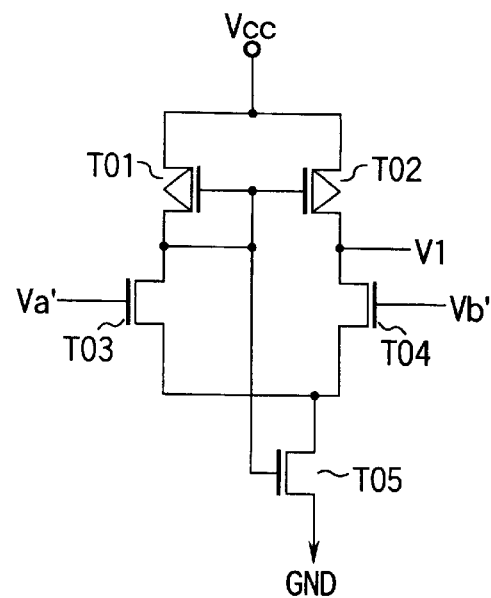
FIG. 16B is a circuit diagram showing a second example of a circuit construction suitable for operational amplifiers in the circuits shown in FIGS. 6A, 6B, 7 and 15.

FIG. 15 shows another example of the construction of the current generating circuit for generating a current varying in proportion to a temperature change shown in FIG. 6A. FIGS. 16A and 16B show circuit constructions suitable for operational amplifiers in the circuits shown in FIGS. 6A, 6B, 7 and 15.

In the circuit shown in FIG. 15, resistors Ra2, Ra1 are serially connected between the anode of the diode D3 and the ground node GND in the circuit shown in FIG. 6A, a potential Va' of the connection node of the resistors Ra2 and Ra1 is supplied to the inverting input terminal (−) of the operational amplifier OP1, resistors Rb2, Rb1 are serially connected between the drain of a MOS transistor TP2 and the ground node GND, and a potential Vb' of the connection node of the resistors Rb2 and Rb1 is supplied to the non-inverting input terminal (+) of the operational amplifier OP1. That is, the input potential to the operational amplifier OP1 is lowered by resistance division.

As shown in FIGS. 16A and 16B, the operational amplifier OP1 includes P-channel MOS transistors T01, TO2 and N-channel MOS transistors TO3 to TO5 and acts as a differential amplifier. The input potentials Va', Vb' are supplied to the gates of the MOS transistors TO3, TO4 and a differential amplification signal (potential V1) is output from the drain common connection node of the MOS transistors TO2, TO4.

In FIG. 15, if the ratio of the resistances of the added resistors is set to Ra2/Ra1=Rb2/Rb1, then, VA=VB when VA'=VB'. In this case, since the input potential of the operational amplifier OP1 can be lowered, the sensitivity can be enhanced when the operational amplifier OP1 has the circuit construction as shown in FIGS. 16A and 16B, for example.

Figure 17:
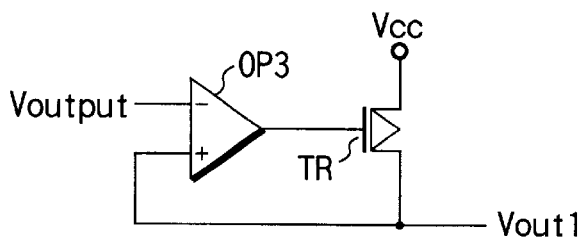
FIG. 17 is a circuit diagram for illustrating a modification of the circuits shown in FIGS. 5 and 8 to 10B.

FIG. 17 illustrates a modification of the voltage generator described above and shows an amplifier circuit for amplifying and outputting the output voltage Voutput of the circuit shown in FIG. 8. In the case of the circuit constructions shown in FIGS. 5 and 9A to 12B, Vcg01, Vcg00, Vcg10 are input to Voutput in FIGS. 17 and 18. The circuit includes an operational amplifier OP3 and a P-channel MOS transistor TR. The output voltage Voutput is supplied to the inverting input terminal (−) of the operational amplifier OP3 and the output terminal thereof is connected to the gate of the MOS transistor TR. The source of the MOS transistor TR is connected to the power supply Vcc and the drain thereof is connected to the non-inverting input terminal (+) of the operational amplifier OP3. An output voltage Vout1 which is the same as Voutput is output from the drain of the MOS transistor TR.

Thus, the current supply ability can be enhanced by providing the amplifier circuit.

Figure 18:
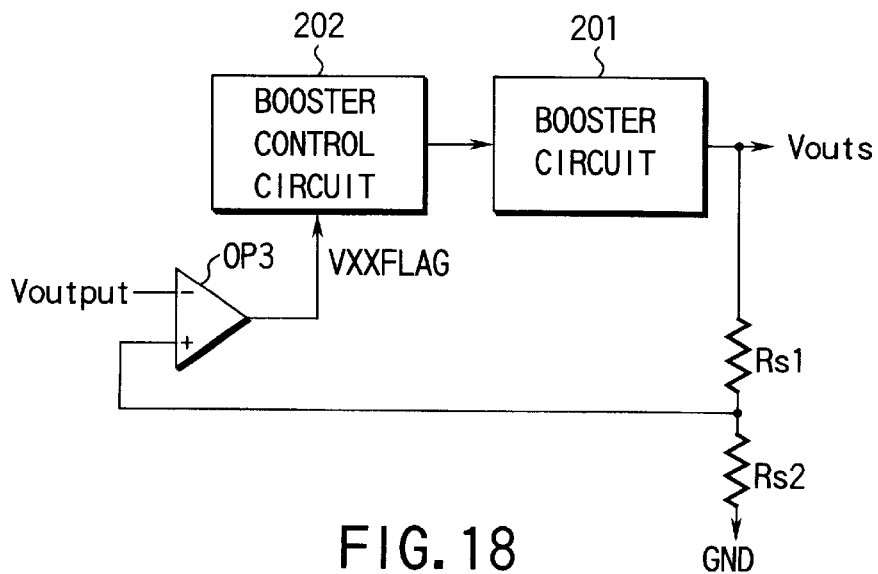
FIG. 18 is a circuit diagram for illustrating another modification of the circuits shown in FIGS. 5 and 8 to 10B.

Further, if it is required to provide an output voltage Voutput which is higher than the power supply voltage Vcc, an output of the operational amplifier OP3 may be raised as shown in FIG. 18. That is, an output signal VXXFLAG of the operational amplifier OP3 is supplied to a booster control circuit 202 whose output is in turn supplied to and controlled by a booster circuit 201. Resistors Rs1 and Rs2 are serially connected between the output terminal of the booster circuit 201 and the ground node GND and the connection node of the resistors is connected to the non-inverting input terminal (+) of the operational amplifier OP3. Thus, an output voltage Vouts higher than the power supply voltage Vcc can be obtained from the output terminal of the booster circuit 201.

Figure 19:
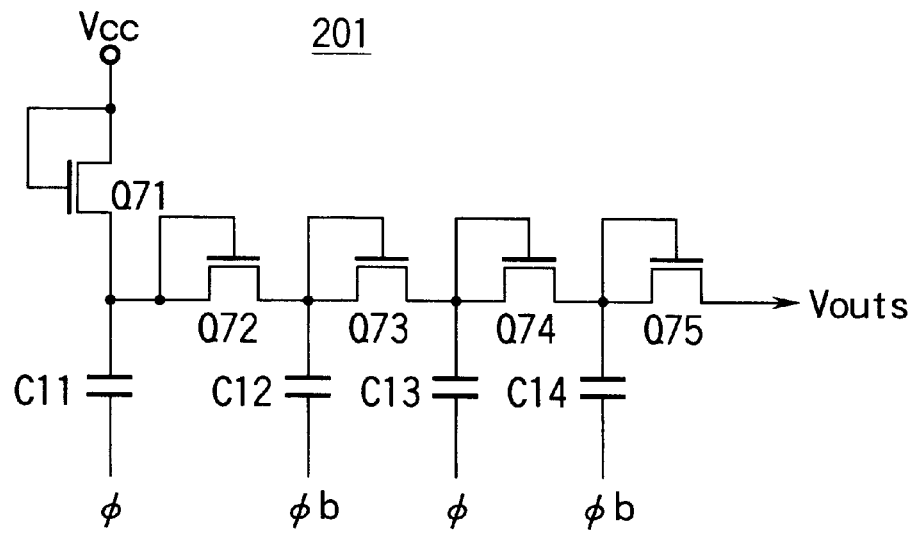
FIG. 19 is a circuit diagram showing an example of the construction of a booster circuit in the circuit shown in FIG. 18.

For example, as shown in FIG. 19, the booster circuit 201 includes N-channel MOS transistors Q71 to Q75 serially connected between a power supply terminal to which the power supply voltage Vcc is applied and the output terminal Vouts and pumping capacitors C11 to C14 whose one-side electrodes are connected to the respective connection nodes of the above MOS transistors. A clock signal $\phi$ is supplied to the other electrodes of the odd-numbered capacitors C11, C13 and a clock signal $\phi$b which is complementary to the clock signal $\phi$ is supplied to the other electrodes of the even-numbered capacitors C12, C14. With this connection, charge storage of each capacitor and charge transfer in one direction are repeatedly effected to provide a boosted output voltage Vouts higher than the power supply voltage Vcc.

Figure 20:
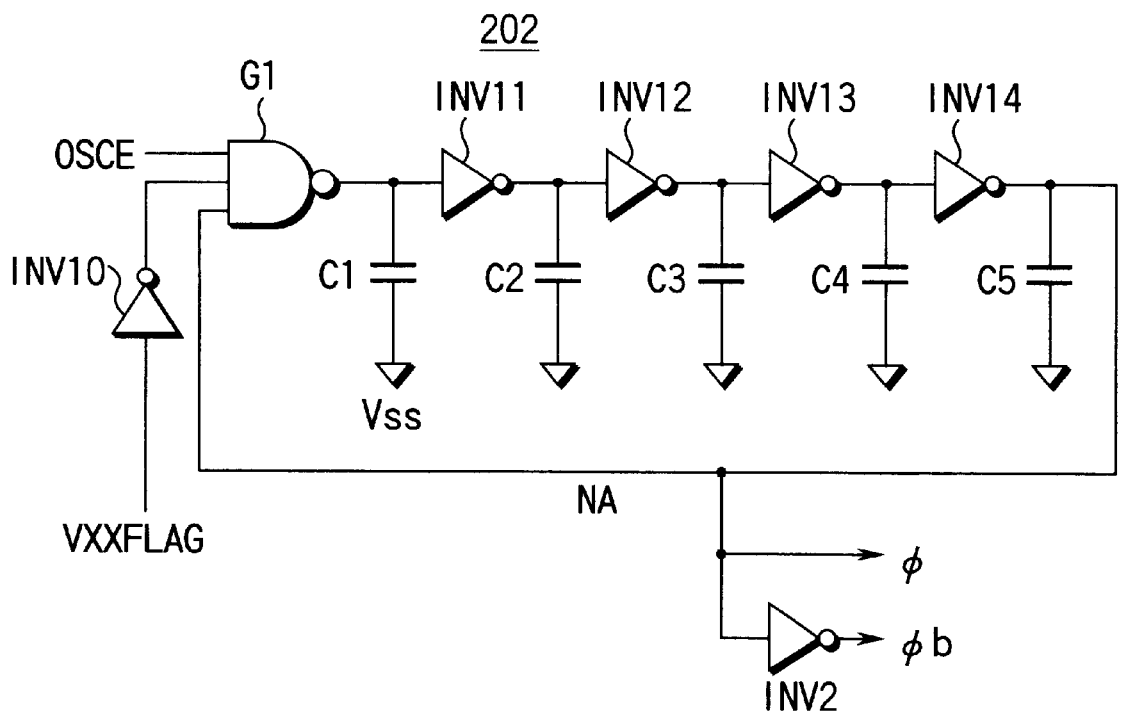
FIG. 20 is a circuit diagram showing an example of the construction of a booster control circuit in the circuit shown in FIG. 18.

The booster control circuit 202 is used for generating the complementary clock signals $\phi$, $\phi$b and includes a ring oscillator which is constructed by a NAND gate G1, inverters INV10 to INV14 and capacitors C1 to C5 as shown in FIG. 20, for example. An oscillation enable signal OSCE is input to the first input terminal of the NAND gate G1 to cause the oscillation operation to be effected when the oscillation enable signal OSCE is set at the "H" level. To the second input terminal of the NAND gate G1, the output signal VXXFLAG of the operational amplifier OP3 shown in FIG. 18 is supplied via the inverter INV10. The output signal VXXFLAG is normally set at the "L" level and is used as a control signal for setting ON/OFF the boosting operation. To the third input terminal of the NAND gate G1, an output signal of the INV14 is fed back.

In the circuit of FIG. 18, the signal VXXFLAG is kept at the "L" level and the booster circuit 201 continues the boosting operation until the output voltage Vouts reaches a voltage expressed as follows.

$$\text{Vouts}=[(\text{Rs1}+\text{Rs2})/\text{Rs2}]\times\text{Voutput}$$

Then, when the output voltage of the booster circuit reaches the above voltage, the signal VXXFLAG is set to the "H" level to interrupt the boosting operation.

Thus, the output voltage Vouts reaches the voltage expressed in the above equation. As described before, since the output voltage Voutput can be set so as to exhibit various temperature dependencies, the output voltage Vouts obtained by boosting the above voltage can also be made to exhibit various temperature dependencies.

Figure 21:
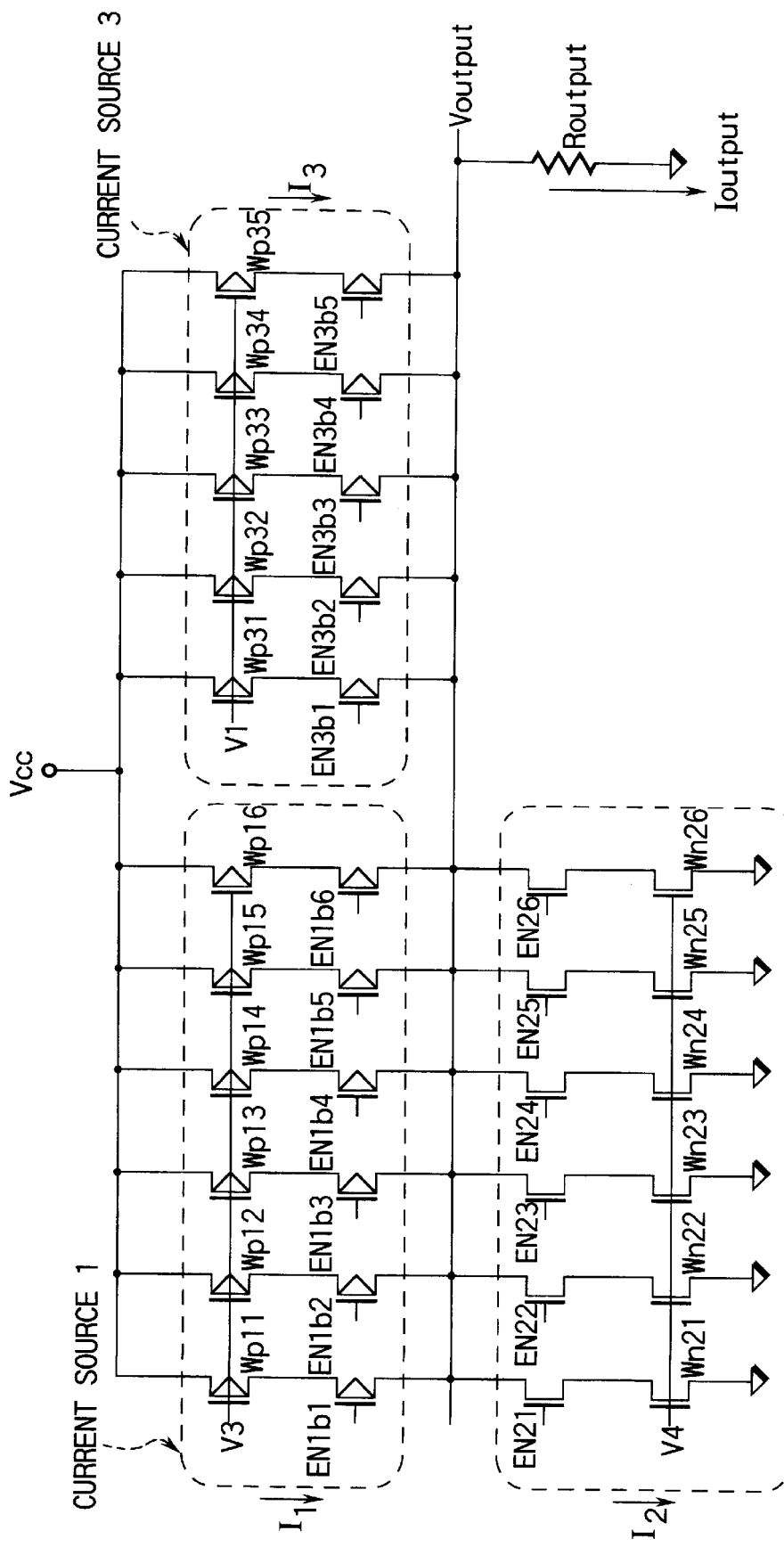
FIG. 21 is a circuit diagram showing a modification of a voltage generator shown in FIG. 18.

This invention can be variously modified. For example, as shown in FIG. 21, if the current source 4 in the circuit of FIG. 8 is omitted and the current sources 1, 2, 3 are provided, then a voltage generator having various voltages and exhibiting various positive temperature characteristics as described before can be attained. As is explained in the item (1), if only the current sources 1, 3 or only the current sources 3, 2 are provided, a voltage generator having various voltages and exhibiting various positive temperature characteristics can be attained.

Figure 22:
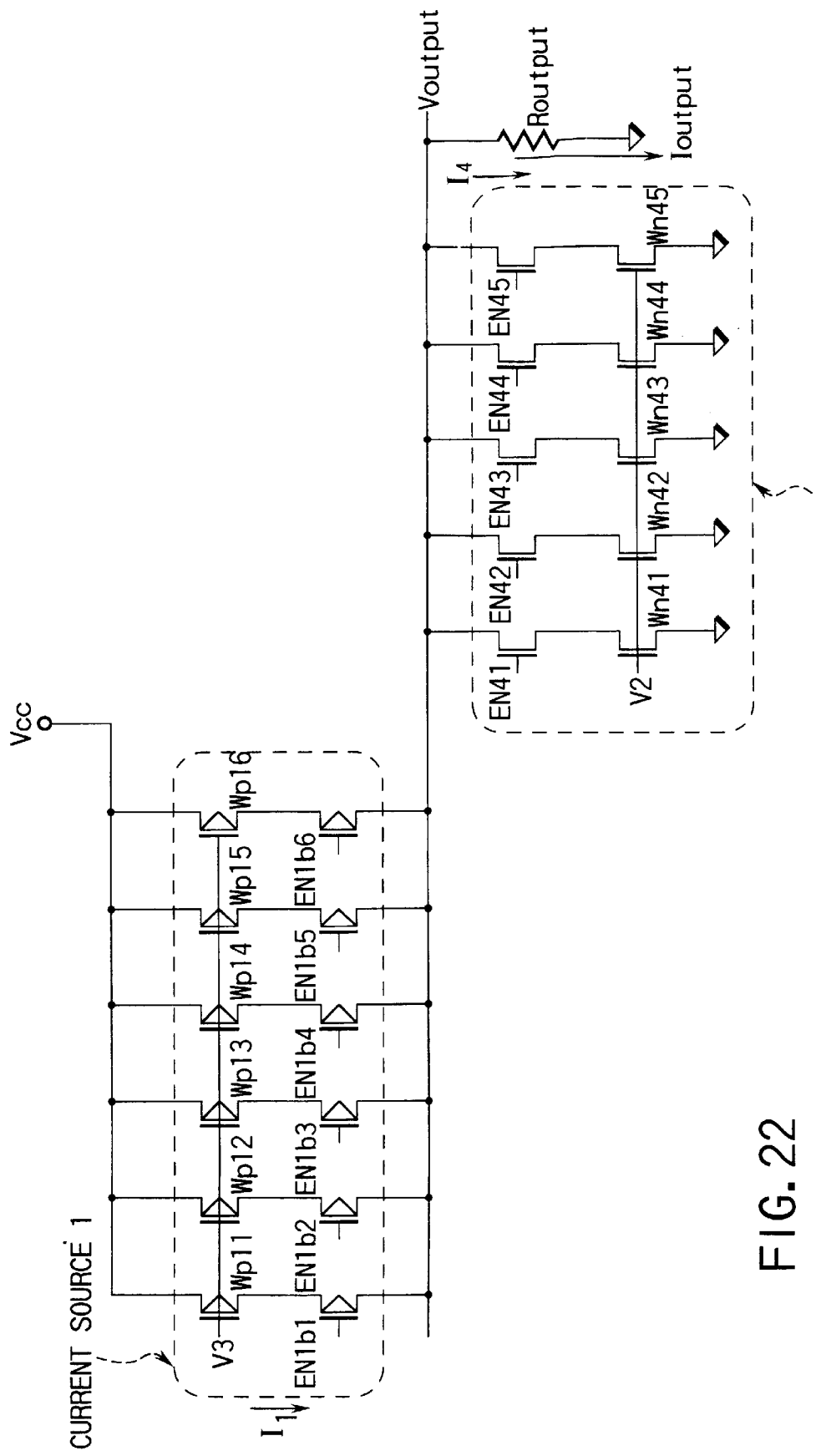
FIG. 22 is a circuit diagram showing another modification of the voltage generator shown in FIG. 18.

Further, as shown in FIG. 22, if the current sources 1, 4 are provided, a voltage generator having various voltages and exhibiting various negative temperature characteristics can be attained as explained above.

Figure 23:
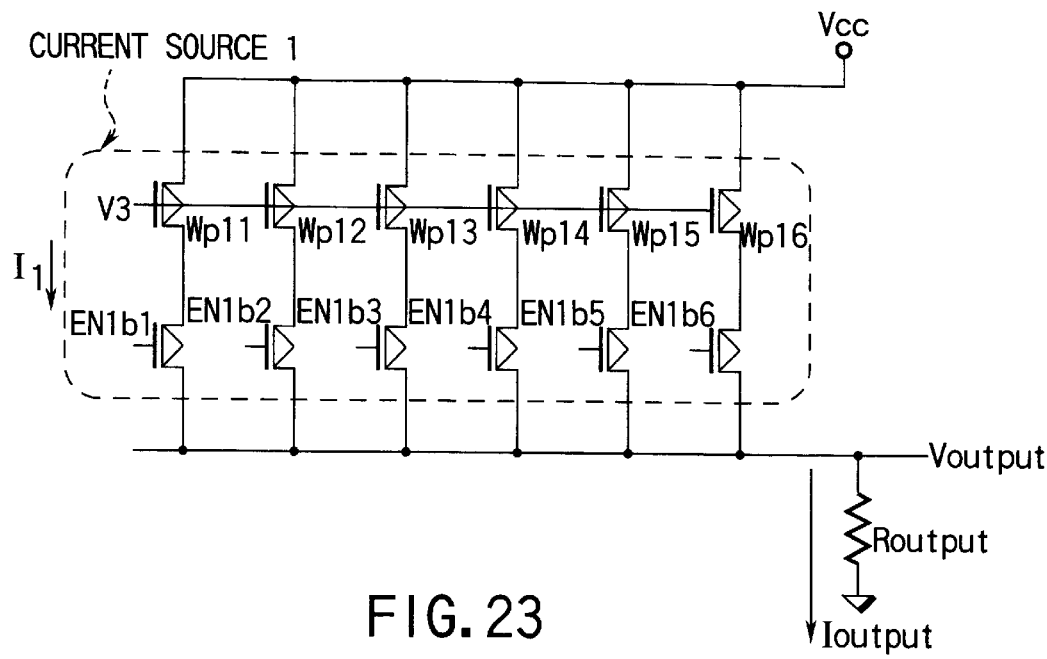
FIG. 23 is a circuit diagram showing still another modification of the voltage generator shown in FIG. 18.

In addition, as shown in FIG. 23, if only the current source 1 is provided, a voltage generator having various voltages and independent of the temperature change can be attained as explained above.

In the circuit of FIG. 8, the absolute value of the output voltage Voutput can be adjusted by changing the total sum of the channel widths of the MOS transistors which are turned ON in each current source. For example, when the output voltage Voutput fluctuates due to a variation in the resistances of the resistance elements for each chip, the enable signals EN1b1, EN1b2, ..., EN1b5, EN1b6 or the enable signals EN21, EN22, ..., EN25, EN26 are selectively set to the "H" level/"L" level according to, for example, data stored in fuse elements or a command input from the exterior to adjust the value of the output voltage Voutput.

The temperature dependency of the output voltage Voutput can also be adjusted by changing the total sum of the channel widths of the MOS transistors which are turned ON in each current source. For example, if it is required to adjust the temperature dependency of the output voltage Voutput for each chip because a current (cell current) at the readout time of the memory cell is changed for each chip, the enable signals EN3b1, EN3b2, ..., EN3b5 or the enable signals EN41, EN42, ..., EN45 are selectively set to the "H" level/"L" level according to, for example, data stored in fuse elements or a command input from the exterior to adjust the temperature dependency of the output voltage Voutput.

Further, it is, of course, possible to provide the construction shown in FIGS. 17 and 18 in the output terminal of the circuit shown in FIGS. 21 to 23.

According to the above construction, the voltage generator can be selectively set to have one of the three characteristics, that is, the positive temperature characteristic, negative temperature characteristic and the characteristic having no temperature dependency according to the enable signals EN1b, EN2, EN3b, EN4 and the above characteristics can be selectively used as required.

Second Embodiment

Next, a case wherein the above voltage generator is used in a nonvolatile semiconductor memory device is explained. In this case, a NAND cell type EEPROM is taken as one example of the nonvolatile semiconductor memory device and explained.

Figure 24:
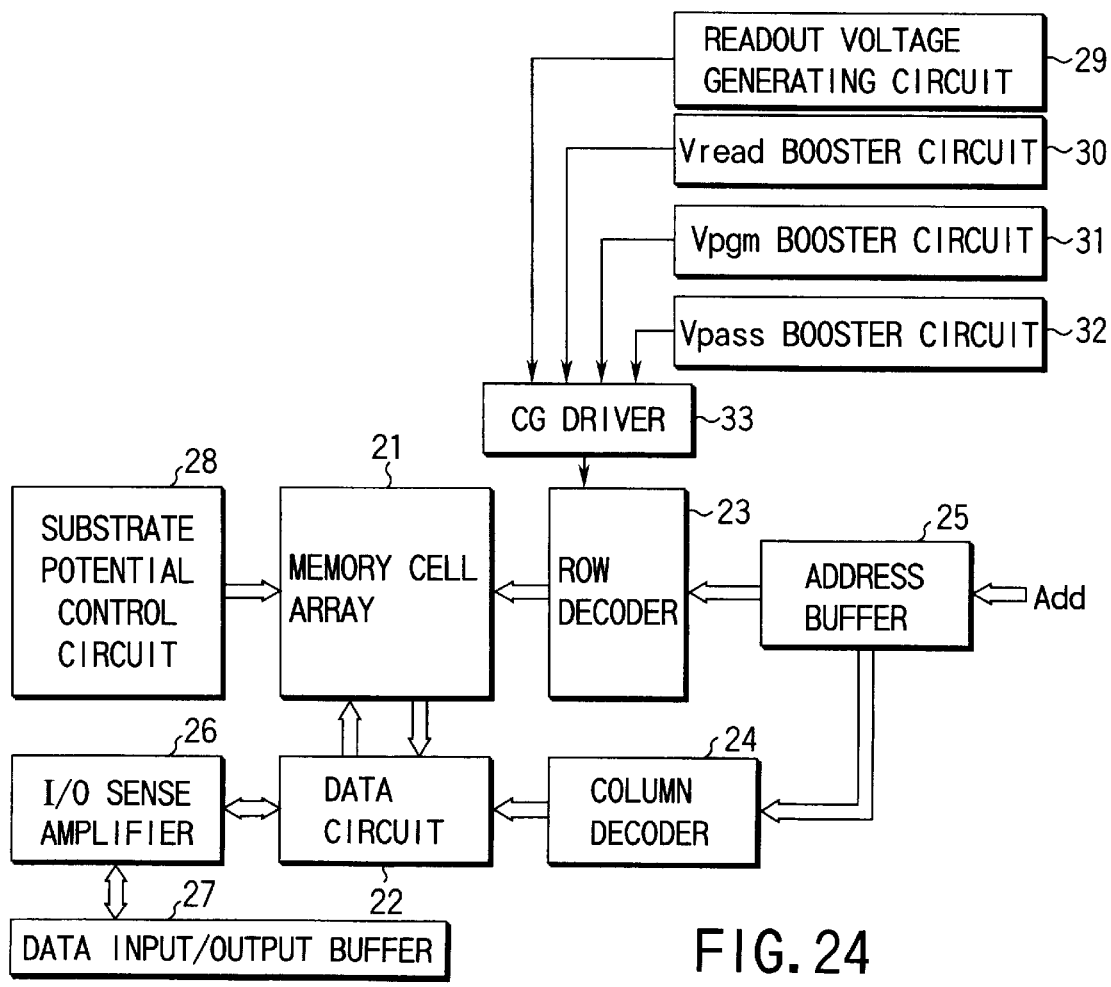
FIG. 24 is a block diagram showing the schematic construction of a NAND cell type EEPROM.

FIG. 24 is a block diagram showing the schematic construction of the NAND cell type EEPROM. In FIG. 24, a reference numeral 21 denotes a memory cell array having memory cells arranged in a matrix form, 22 denotes a data circuit for temporarily storing programming data, readout data, 23 denotes a row decoder for selecting word lines, 24 denotes a column decoder for selecting bit lines, 25 denotes an address buffer to which an address signal Add is input, 26 denotes an I/O sense amplifier, 27 denotes a data input/output buffer, 28 denotes a substrate potential control circuit, 29 denotes a readout voltage generator for generating a readout voltage applied to a selected word line at the read time, 30 denotes a Vread booster circuit for generating a voltage Vread applied to non-selected word lines at the read time, 31 denotes a Vpgm booster circuit for generating a voltage Vpgm applied to a selected word line at the programming time, 32 denotes a Vpass booster circuit for generating a voltage Vpass applied to non-selected word lines at the programming time and 33 denotes a control gate driver (CG driver). Although not shown in the drawing, it should be noted that the booster circuit for generating an erase voltage is also contained in the above circuit.

The output voltages of the readout voltage generator 29, Vread booster circuit 30, Vpgm booster circuit 31 and Vpass booster circuit 32 are supplied to the control gate driver 33. The control gate driver 33 is a switching circuit for selectively transferring the readout voltage, voltage Vread, voltage Vpgm and voltage Vpass to the word line of the memory cell array 21 via the row decoder 23.

In this invention, the voltage of the control gate in the read/verify mode is controlled to compensate for the temperature dependency of the memory cell current in the read/verify mode by use of the voltage generator explained in the first embodiment.

Figure 25:
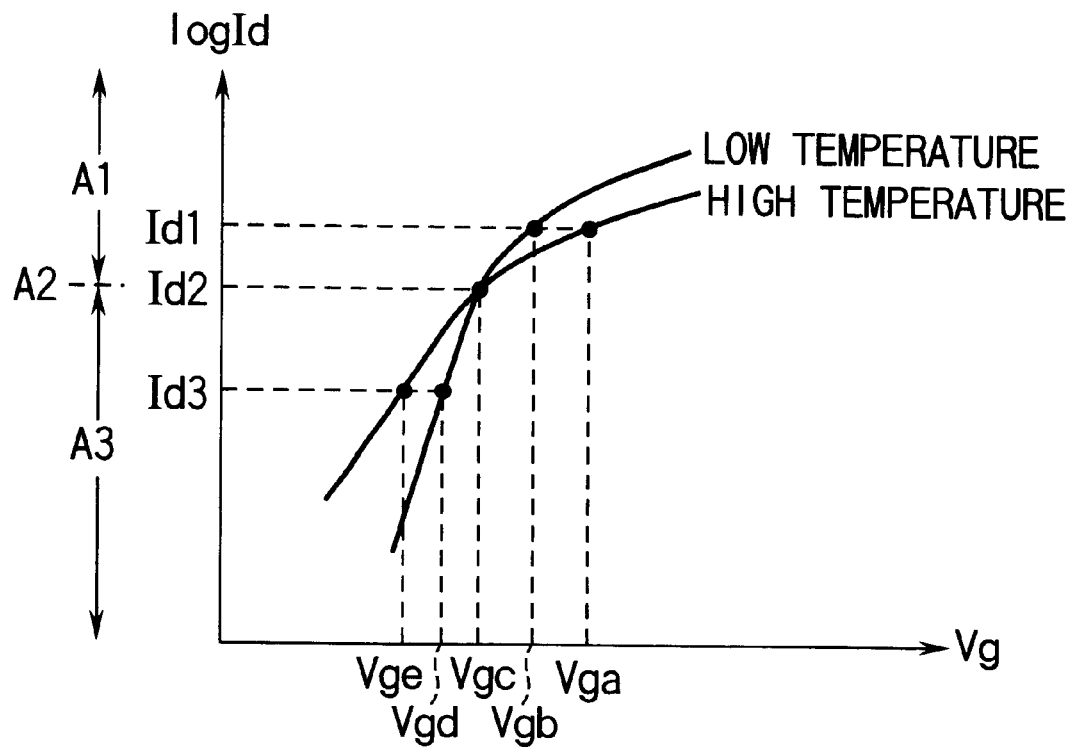
FIG. 25 is a diagram showing the drain current-gate voltage characteristic of a memory cell transistor.

FIG. 25 shows the drain current Id-gate voltage Vg characteristic of a memory cell transistor. The temperature characteristic is different depending on the drain current Id used for effecting the sensing operation. The magnitude of the drain current Id used for sensing at the read time is determined by the readout time and array noise.

(1) A case wherein a positive temperature characteristic is given to Vg:

The drain current Id required for reading out data from the memory cell is expressed as follows if the bit line capacity is set to CB, time for discharging the bit line by use of the cell current is set to TBL and the amplitude of a potential of the bit line required for reading is set to ΔV.

$$Id = CBL \cdot \Delta V / TBL$$

Therefore, in a case where the readout time is reduced (TBL is short), the drain current Id to be sensed becomes larger. An area A1 in FIG. 25 indicates a case where the drain current Id sensed is large. In the area A1, the current value is larger at the low temperature than at the high temperature when using the same gate voltage Vg. In this invention, the gate voltage of the selected memory cell is so controlled as to become higher at the high temperature (vga) than at the low temperature (Vgb) at the read/verify read time so that a drain current Id1 which is constant irrespective of the temperature change can be attained.

(2) A case wherein a negative temperature characteristic is given to Vg:

If the readout time is set long, the drain current Id necessary for reading becomes smaller because TBL is longer, and an area A3 of FIG. 25 is obtained. The array noise in the memory cell array 11 can be made small and the width of the threshold voltage distribution can be made narrow by setting the readout time long. In the area A3, the current value is larger at the high temperature than at the low temperature when using the same gate voltage Vg. In this invention, the gate voltage Vg of the selected memory cell is so controlled as to become lower at the high temperature (Vge) than at the low temperature (Vgd) at the read/verify read time so that a drain current Id3 which is constant irrespective of the temperature change can be attained.

(3) A case wherein the temperature dependency of Vg is eliminated:

In an area A2 of FIG. 25, that is, if the current to be sensed is Id2, the current value is independent of the temperature change with respect to a gate voltage Vgc. In this case, the gate voltage of the selected memory cell is made constant irrespective of the temperature change at the read/verify read time.

As described above, in this invention, the voltage generator which can variously adjust the positive and negative temperature characteristics is used to generate the control gate voltage at the read/verify read time so that a variation of the memory cell current due to the temperature change can always be eliminated even if the readout time is variously changed. Further, the width of the threshold voltage distribution can be made narrower by eliminating the temperature dependency of the readout current.

Third Embodiment

Figure 26:
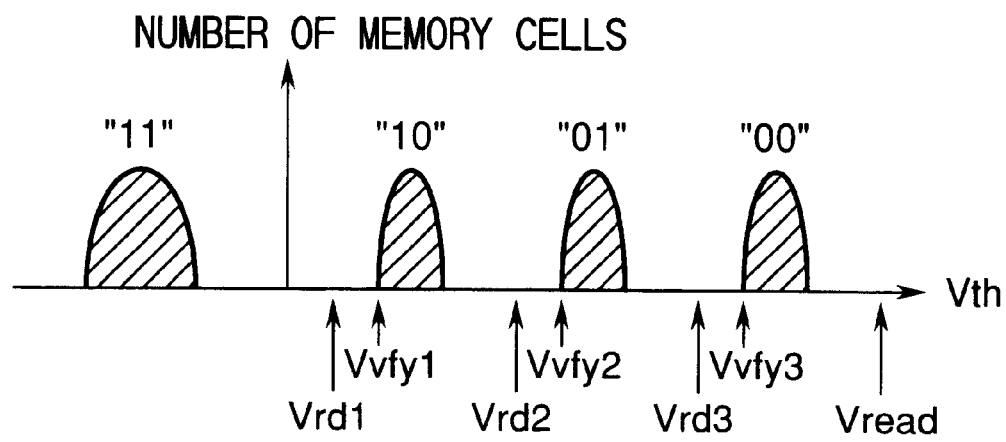
FIG. 26 is a diagram showing the threshold voltage distribution of four-value memory cells.

The voltage generator of this invention becomes more effective in a multi-value memory having a threshold voltage distribution as shown in FIG. 26. FIG. 26 shows the threshold voltage distribution of a four-value memory cell. The operation of the multi-value memory is substantially the same as that of the 2-value memory. For example, in the readout operation, a voltage Vrd1 (for example, 0.05V or 0V) is applied to the selected control gate to detect whether or not a current flows in the memory cell in a case where data "11" or data "10", "01", "00" is read out. In a case where data "11", "10" or data "01", "00" is read out, a voltage Vrd2 (for example, 0.7V) is applied to the selected control gate to detect whether or not a current flows in the memory cell. In a case where data "11", "10", "01" or data "00" is read out, a voltage Vrd3 (for example, 1.45V) is applied to the selected control gate to detect whether or not a current flows in the memory cell.

In the "10" verify read operation, the selected control gate is set to Vvfy1 (for example, 0.15V). In the "01" verify read operation, the selected control gate is set to Vvfy2 (for example, 0.9V). In the "00" verify read operation, the selected control gate is set to Vvfy3 (for example, 1.75V).

In this invention, various voltages which vary with the temperature change in the same manner can be generated by changing the current $I_1$ or $I_2$ which is independent of the temperature change while the current $I_3$ or $I_4$ which depends on the temperature change in FIG. 5 is kept constant. That is, the voltages Vrd1, Vrd2, Vrd3, Vvfy1, Vvfy2, Vvfy3 having the same temperature dependency can be generated by changing the current $I_1$ or $I_2$ by use of the circuit shown in FIG. 5. Alternatively, the temperature dependencies of the voltages Vrd1, Vrd2, Vrd3, Vvfy1, Vvfy2, Vvfy3 can be adjusted in the same manner by adjusting the currents $I_3$, $I_4$.

Figure 2A:
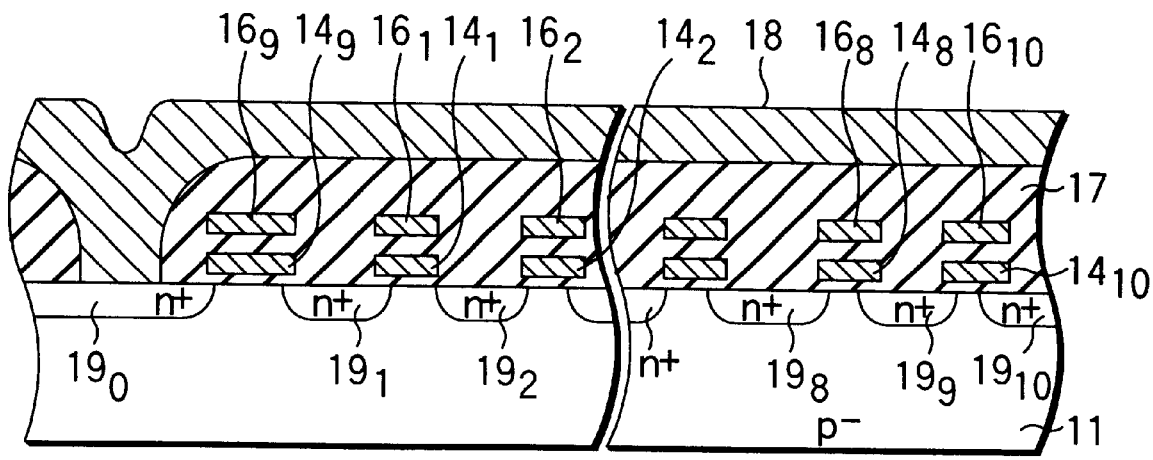
FIG. 2A is a cross sectional view taken along the 2A—2A line in the pattern of FIG. 1A.
Figure 2B:
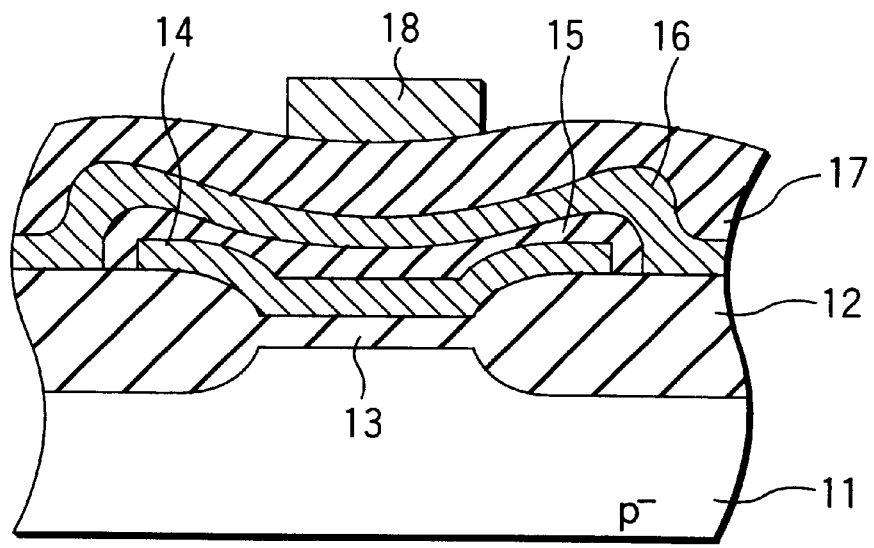
FIG. 2B is a cross sectional view taken along the 2B—2B line in the pattern of FIG. 1A.
Figure 3:
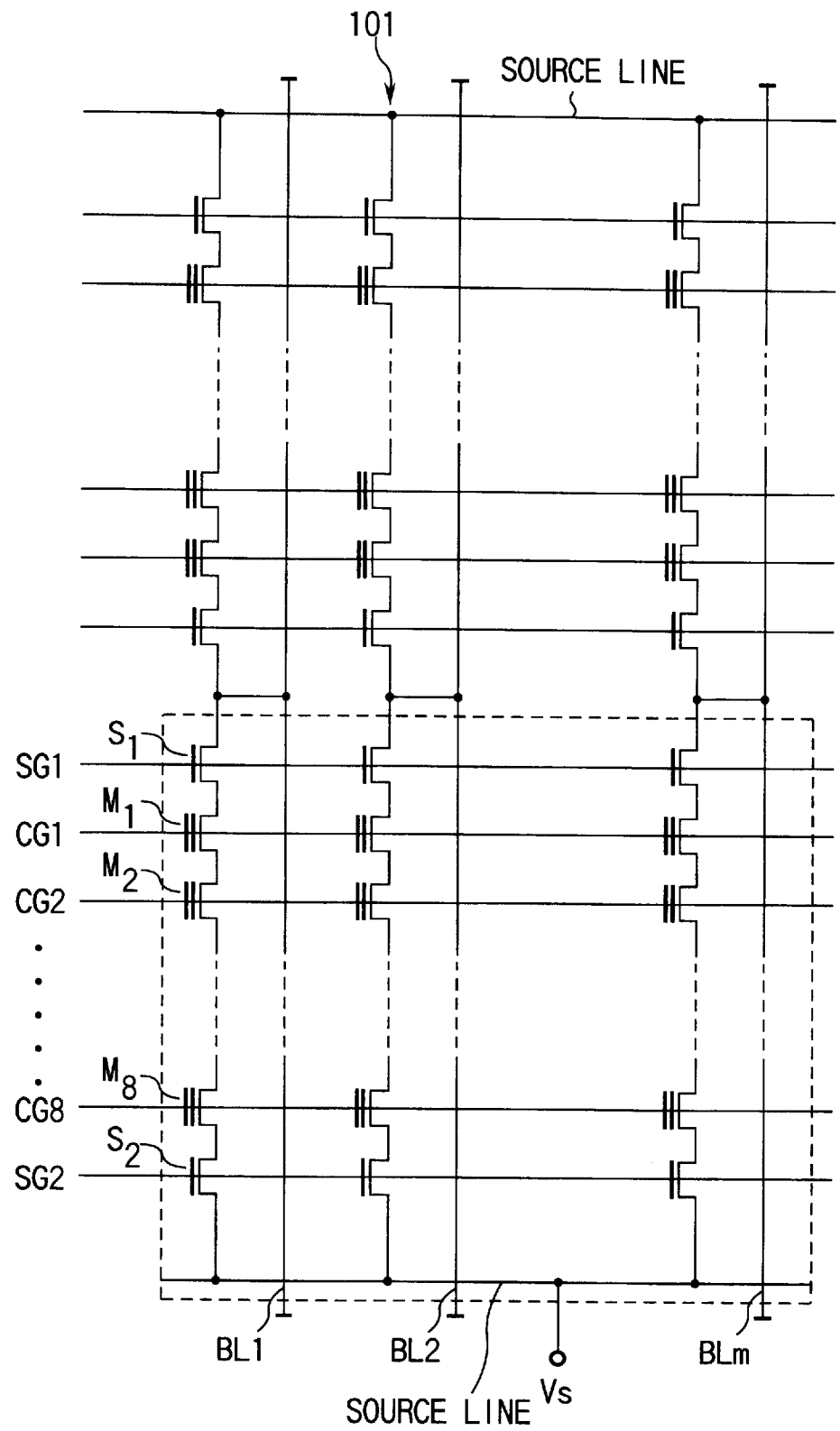
FIG. 3 is an equivalent circuit diagram of a memory cell array obtained by arranging NAND cells in a matrix form.
Figure 4:
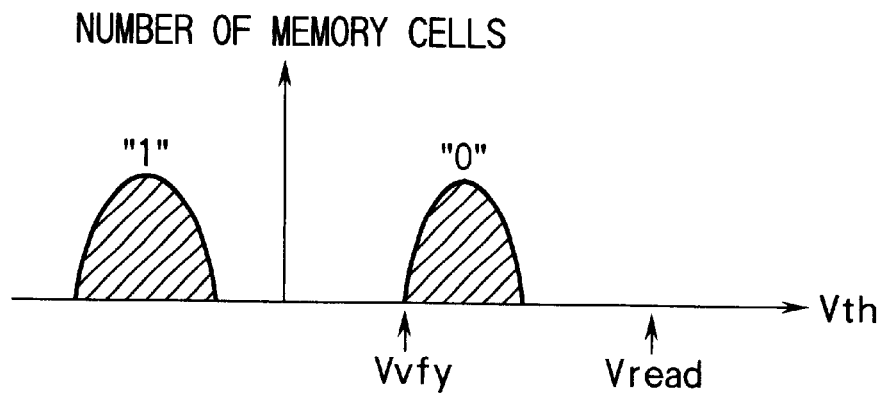
FIG. 4 is a diagram for illustrating the threshold voltage distribution of NAND cells.

In a NAND flash memory, a voltage Vread which is higher than the programming threshold voltage as shown in FIGS. 4 and 26 is applied to the selected gate and the gates of the non-selected memory cells serially connected to the selected cell at the read/verify read time. Like the voltages Vrd1, Vvfy1 and the like, the voltage Vread may have the temperature dependency by use of the circuit shown in FIG. 5. As a result, since the temperature dependency of the resistances of the non-selected memory cells and selected gate can be eliminated at the read/verify read time, a highly precise readout operation and the narrow threshold voltage distribution width can be attained.

The constant current generating circuit of this invention can be variously modified. For example, the channel widths of the MOS transistors TP1, TP2, TP3, TN1, TP4, TP5, TN2 in the circuits shown in FIGS. 6A and 6B can be made variable. In this case, since the current $I_{10}$, $I_{20}$ in FIG. 6A can be changed, it becomes impossible to change the current of the current source in FIG. 8 and the temperature dependency and the value of the output voltage Voutput in FIG. 8 can be variously changed. It is, of course, possible to make variable the channel widths of the MOS transistors TP1, TP2, TP3, TN1, TP4, TP5, TN2 in FIGS. 6A and 6B by use of a command or data stored in the fuse elements. Further, the total sum of the channel widths of the transistors of the current source of FIG. 8 can be made variable by use of a command or data stored in the fuse elements.

In the above embodiments, an example in which the NAND cell type EEPROM is used is explained, but this invention can be applied to any type of flash memory such as a NOR type, AND type (A. Nozoe: ISSCC, Digest of Technical Papers, 1995), DINOR type (S. Kobayashi: ISSCC, Digest of Technical Papers, 1995), NAND type, Virtual Ground Array type (Lee, et al: Symposium on VLSI Circuits, Digest of Technical Papers, 1994). Further, this invention is not limited to the flash memory and can be applied to a mask ROM, EPROM and the like. That is, in the above devices other than the NAND flash memory, a highly precise readout operation and the narrow threshold voltage distribution width can be attained by causing the word line voltage at the read/verify read time to have the temperature characteristic.

As described above, according to this invention, a voltage generator capable of suppressing an influence due to the temperature variation can be attained.

Further, a voltage generator capable of suppressing the spreading of the threshold voltage distribution of memory cells due to the temperature variation in a nonvolatile semiconductor memory device can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage generator comprising:
   a first terminal acting as an output terminal;
   a constant current source connected to said first terminal, for supplying or discharging a constant current which is substantially independent of a temperature change to or from said first terminal;
   a temperature-dependent current source connected to said first terminal, for supplying or discharging a temperature-dependent current which changes as temperature varies to or from said first terminal;
   a first current/voltage converter connected to said first terminal;
   a constant current generating circuit connected to said first terminal and including
      a second current/voltage converter connected between second and third terminals, and
      a first control circuit for controlling a voltage between the second and third terminals to a constant voltage which is substantially independent of a temperature change; and
   a temperature-dependent current generating circuit connected to said first terminal and including
      a first diode element connected between fourth and fifth terminals,
      a third current/voltage converter connected between sixth and seventh terminals,
      a second diode element connected between the fifth and seventh terminals, and
      a second control circuit for controlling potentials of the fourth and sixth terminals to the same potential.

2. The voltage generator according to claim 1, wherein the temperature-dependent current varies in proportion to an absolute temperature.

3. The voltage generator according to claim 1, wherein said first current/voltage converter is connected between said first terminal and a ground potential.

4. The voltage generator according to claim 3, wherein said first current/voltage converter includes at least one of a resistor and a transistor.

5. The voltage generator according to claim 1, wherein at least one of the constant current and the temperature-dependent current is changed according to at least one of an operation mode of a peripheral circuit, a command supplied from the exterior and data stored in fuse elements.

6. The voltage generator according to claim 1, wherein the constant current is created based on a current flowing through said second current/voltage converter and the temperature-dependent current is created based on a current flowing through said third current/voltage converter.

7. A voltage generator comprising:
a first terminal acting as an output terminal;
a constant current source connected to said first terminal, for supplying or discharging a constant current which is substantially independent of a temperature change to or from said first terminal;
a temperature-dependent current source connected to said first terminal, for supplying or discharging a temperature-dependent current which changes as temperature varies to or from said first terminal;
a first current/voltage converter connected to said first terminal;
a constant current generating circuit connected to said first terminal and including
a second current/voltage converter connected between second and third terminals, and
a first control circuit for controlling a voltage between the second and third terminals to a constant voltage which is substantially independent of a temperature change; and
a temperature-dependent current generating circuit connected to said first terminal and including
a constant current generating device for supplying a constant current to a fourth terminal,
a diode element connected between the fourth terminal and a fifth terminal,
a third current/voltage converter connected between the fifth terminal and a sixth terminal, and
a second control circuit for controlling potentials of the fourth and sixth terminals to the same potential.

8. The voltage generator according to claim 7, wherein the constant current is created based on a current flowing through said second current/voltage converter and the temperature-dependent current is created based on a current flowing through said third current/voltage converter.

9. A voltage generator comprising:
a first terminal acting as an output terminal;
a first constant current source connected to said first terminal, for supplying a first constant current which is substantially independent of a temperature change to said first terminal;
a second constant current source connected to said first terminal, for discharging a second constant current which is substantially independent of a temperature change from said first terminal;
a first temperature-dependent current source connected to said first terminal, for supplying a first temperature-dependent current which changes as temperature varies to said first terminal;
a second temperature-dependent current source connected to said first terminal, for discharging a second temperature-dependent current which changes as temperature varies from said first terminal; and
a first current/voltage converter connected to said first terminal.

10. The voltage generator according to claim 9, wherein the first and second temperature-dependent currents vary in proportion to an absolute temperature.

11. The voltage generator according to claim 9, wherein said first current/voltage converter is connected between said first terminal and a ground potential.

12. The voltage generator according to claim 11, wherein said first current/voltage converter includes at least one of a resistor and a transistor.

13. The voltage generator according to claim 9, wherein at least one of the first and second constant currents and the first and second temperature-dependent currents is changed according to at least one of an operation mode of a peripheral circuit, a command supplied from the exterior and data stored in fuse elements.

14. The voltage generator according to claim 9, further comprising first and second constant current generating circuits connected to said first terminal, and first and second temperature-dependent current generating circuits connected to said first terminal,
said first constant current generating circuit includes a second current/voltage converter connected between second and third terminals, and a first control circuit for controlling a voltage between the second and third terminals to a constant voltage which is substantially independent of a temperature change;
said first temperature-dependent current generating circuit includes a first diode element connected between fourth and fifth terminals, a third current/voltage converter connected between sixth and seventh terminals, a second diode element connected between the seventh and fifth terminals, and a second control circuit for controlling potentials of the fourth and sixth terminals to the same potential;
said second constant current generating circuit includes a fourth current/voltage converter connected between eighth and ninth terminals, and a third control circuit for controlling a voltage between the eighth and ninth terminals to a constant voltage which is substantially independent of a temperature change; and
said second temperature-dependent current generating circuit includes a third diode element connected between tenth and eleventh terminals, a fifth current/voltage converter connected between twelfth and thirteenth terminals, a fourth diode element connected between the thirteenth and eleventh terminals, and a fourth control circuit for controlling potentials of the tenth and twelfth terminals to the same potential.

15. The voltage generator according to claim 14, wherein the first or second constant current is created based on a current flowing through said second current/voltage converter, the first or second temperature-dependent current is created based on a current flowing through said third current/voltage converter.

16. The voltage generator according to claim 9, further comprising a first constant current generating circuit connected to said first terminal and including
a second current/voltage converter connected between second and third terminals, and
a first control circuit for controlling a voltage between the second and third terminals to a constant voltage which is substantially independent of a temperature change;
a second constant current generating circuit connected to said first terminal and including
a third current/voltage converter connected between fourth and fifth terminals, and a second control circuit for controlling a voltage between the fourth and fifth terminals to a constant voltage which is substantially independent of a temperature change;

a first temperature-dependent current generating circuit connected to said first terminal and including
 a first constant current generating device for supplying a constant current to a sixth terminal,
 a first diode element connected between the sixth terminal and a seventh terminal,
 a fourth current/voltage converter connected between the seventh terminal and an eighth terminal, and
 a third control circuit for controlling potentials of the sixth and eighth terminals to the same potential; and a second temperature-dependent current generating circuit connected to said first terminal and including
 a second constant current generating device for supplying a constant current to a ninth terminal,
 a second diode element connected between the ninth terminal and a tenth terminal,
 a fifth current/voltage converter connected between the tenth terminal and an eleventh terminal, and
 a fourth control circuit for controlling potentials of the ninth and eleventh terminals to the same potential.

17. The voltage generator according to claim 16, wherein the first or second constant current is created based on a current flowing through said second current/voltage converter, the first or second temperature-dependent current is created based on a current flowing through said third current/voltage converter.

18. A voltage generator comprising:
a first terminal acting as an output terminal;
a first constant current source connected to said first terminal, for supplying a constant current which is substantially independent of a temperature change to said first terminal;
a first temperature-dependent current source connected to said first terminal, for discharging a temperature-dependent current which changes as temperature varies from said first terminal; and
a first current/voltage converter connected to said first terminal,
wherein at least one of the constant current and the temperature-dependent current is changed according to at least one of an operation mode of a peripheral circuit, a command supplied from the exterior and data stored in fuse elements.

19. The voltage generator according to claim 18, wherein the temperature-dependent current varies in proportion to an absolute temperature.

20. The voltage generator according to claim 18, wherein said first current/voltage converter is connected between said first terminal and a ground potential.

21. The voltage generator according to claim 20, wherein said first current/voltage converter includes at least one of a resistor and a transistor.

22. The voltage generator according to claim 18, further comprising:
a constant current generating circuit connected to said first terminal and including
 a second current/voltage converter connected between second and third terminals, and
 a first control circuit for controlling a voltage between the second and third terminals to a constant voltage which is substantially independent of a temperature change; and a temperature-dependent current generating circuit connected to said first terminal and including
 a first diode element connected between fourth and fifth terminals,
 a third current/voltage converter connected between sixth and seventh terminals,
 a second diode element connected between the fifth and seventh terminals, and
 a second control circuit for controlling potentials of the fourth and sixth terminals to the same potential.

23. The voltage generator according to claim 22, wherein the constant current is created based on a current flowing through said second current/voltage converter and the temperature-dependent current is created based on a current flowing through said third current/voltage converter.

24. A voltage generator comprising:
a first terminal acting as an output terminal;
a first constant current source connected to said first terminal, for supplying a constant current which is substantially independent of a temperature change to said first terminal;
a first temperature-dependent current source connected to said first terminal, for discharging a temperature-dependent current which changes as temperature varies from said first terminal;
a first current/voltage converter connected to said first terminal
a constant current generating circuit connected to said first terminal and including
 a second current/voltage converter connected between second and third terminals, and
 a first control circuit for controlling a voltage between the second and third terminals to a constant voltage which is substantially independent of a temperature change; and a temperature-depend current generating circuit connected to said first terminal and including
 a constant current generating device for supplying a constant current to a fourth terminal,
 a diode element connected between the fourth terminal and a fifth terminal,
 a third current/voltage converter connected between the fifth terminal and a sixth terminal, and
 a second control circuit for controlling potentials of the fourth and sixth terminals to the same potential.

25. The voltage generator according to claim 24, wherein the constant current is created based on a current flowing through said second current/voltage converter and the temperature-dependent current is created based on a current flowing through said third current/voltage converter.

26. A voltage generator comprising:
a first terminal acting as an output terminal;
a constant current source connected to said first terminal, for supplying or discharging a constant current which is substantially independent of a temperature change to or from said first terminal;
a temperature-dependent current source connected to said first terminal, for supplying a temperature-dependent current which changes as temperature varies to said first terminal;
a first current/voltage converter connected to said first terminal;
a constant current generating circuit connected to said first terminal and including
 a second current/voltage converter connected between second and third terminals, and a first control circuit for controlling a voltage between the second and third terminals to a constant voltage which is substantially independent of a temperature change; and a temperature-dependent current generating circuit connected to said first terminal and including
a first diode element connected between fourth and fifth terminals,
a third current/voltage converter connected between sixth and seventh terminals,
a second diode element connected between the fifth and seventh terminals, and
a second control circuit for controlling potentials of the fourth and sixth terminals to the same potential.

27. The voltage generator according to claim 26, wherein the temperature-dependent current varies in proportion to an absolute temperature.

28. The voltage generator according to claim 26, wherein said first current/voltage converter is connected between said first terminal and a ground potential.

29. The voltage generator according to claim 28, wherein said first current/voltage converter includes at least one of a resistor and a transistor.

30. The voltage generator according to claim 26, wherein at least one of the first constant current and the first temperature-dependent current is changed according to at least one of an operation mode of a peripheral circuit, a command supplied from the exterior and data stored in fuse elements.

31. The voltage generator according to claim 26, wherein the constant current is created based on a current flowing through said second current/voltage converter and the temperature-dependent current is created based on a current flowing through said third current/voltage converter.

32. A voltage generator comprising:
a first terminal acting as an output terminal;
a constant current source connected to said first terminal, for supplying or discharging a constant current which is substantially independent of a temperature change to or from said first terminal;
a temperature-dependent current source connected to said first terminal, for supplying a temperature-dependent current which changes as temperature varies to said first terminal;
a first current/voltage converter connected to said first terminal;
a constant current generating circuit connected to said first terminal and including
a second current/voltage converter connected between second and third terminals, and
a first control circuit for controlling a voltage between the second and third terminals to a constant voltage which is substantially independent of a temperature change; and a temperature-dependent current generating circuit connected to said first terminal
a constant current generating device for supplying a constant current to a fourth terminal,
a diode element connected between the fourth terminal and a fifth terminal,
a third current/voltage converter connected between the fifth terminal and a sixth terminal, and
a second control circuit for controlling potentials of the fourth and sixth terminals to the same potential.

33. The voltage generator according to claim 32, wherein the constant current is created based on a current flowing through said second current/voltage converter and the temperature-dependent current is created based on a current flowing through said third current/voltage converter.

34. The voltage generator according to claim 7, wherein the temperature-dependent current varies in proportion to an absolute temperature.

35. The voltage generator according to claim 7, wherein said first current/voltage converter is connected between said first terminal and a ground potential.

36. The voltage generator according to claim 35, wherein said first current/voltage converter includes at least one of a resistor and a transistor.

37. The voltage generator according to claim 7, wherein at least one of the constant current and the temperature-dependent current is changed according to at least one of an operation mode of a peripheral circuit, a command supplied from the exterior and data stored in fuse elements.

38. The voltage generator according to claim 24, wherein the temperature-dependent current varies in proportion to an absolute temperature.

39. The voltage generator according to claim 24, wherein said first current/voltage converter is connected between said first terminal and a ground potential.

40. The voltage generator according to claim 39, wherein said first current/voltage converter includes at least one of a resistor and a transistor.

41. The voltage generator according to claim 32, wherein the temperature-dependent current varies in proportion to an absolute temperature.

42. The voltage generator according to claim 32, wherein said first current/voltage converter is connected between said first terminal and a ground potential.

43. The voltage generator according to claim 42, wherein said first current/voltage converter includes at least one of a resistor and a transistor.

44. The voltage generator according to claim 32, wherein at least one of the first constant current and the first temperature-dependent current is changed according to at least one of an operation mode of a peripheral circuit, a command supplied from the exterior and data stored in fuse elements.

* * * * *